United States Patent
LePoudre

(10) Patent No.: US 11,408,681 B2
(45) Date of Patent: Aug. 9, 2022

(54) EVAPORATIVE COOLING SYSTEM WITH LIQUID-TO-AIR MEMBRANE ENERGY EXCHANGER

(71) Applicant: Nortek Air Solutions Canada, Inc., Saskatoon (CA)

(72) Inventor: Philip Paul LePoudre, Saskatoon (CA)

(73) Assignee: Nortek Air Solations Canada, Iac., Saskatoon (CA)

( * ) Notice: Subject to any disclaimer, the term of this patent is extended or adjusted under 35 U.S.C. 154(b) by 144 days.

(21) Appl. No.: 14/187,413

(22) Filed: Feb. 24, 2014

(65) Prior Publication Data
US 2014/0260369 A1    Sep. 18, 2014

Related U.S. Application Data

(60) Provisional application No. 61/799,321, filed on Mar. 15, 2013.

(51) Int. Cl.
*F28D 5/02* (2006.01)
*F24F 1/0007* (2019.01)
(Continued)

(52) U.S. Cl.
CPC .............. *F28D 5/02* (2013.01); *F24F 1/005* (2019.02); *F24F 1/0007* (2013.01);
(Continued)

(58) Field of Classification Search
CPC ........ F24F 3/1417; F24F 3/147; F24F 5/0035; F24F 12/006; F24F 2012/007; F24F 2001/0085; F24F 2001/0092; F28D 5/02
See application file for complete search history.

(56) References Cited

U.S. PATENT DOCUMENTS 1,015,831 A    1/1912    Pielock et al.
2,186,844 A    1/1940    Smith
(Continued)

FOREIGN PATENT DOCUMENTS

AU    2011286700 A1    12/2012
AU    2014231672 B2    3/2018
(Continued)

OTHER PUBLICATIONS

Khizir Mahmud et al, Performance testing of a counter-cross-flow run-around membrane energy exchanger (RAMEE) system for HVAC applications, Oct. 30, 2009, elsevier, 42, 1139-1147.*
(Continued)

*Primary Examiner* — Christopher R Zerphey
(74) *Attorney, Agent, or Firm* — Schwegman Lundberg & Woessner, P.A.

(57) ABSTRACT

An evaporative cooling system includes an evaporative cooler liquid-to-air membrane energy exchanger (LAMEE), a first liquid-to-air heat exchanger (LAHE), and a cooling fluid circuit. The evaporative cooler LAMEE is disposed within a scavenger air plenum that is configured to channel a scavenger air stream. The first LAHE is disposed within a process air plenum that is configured to channel a process air stream. The cooling fluid circuit is configured to circulate an evaporative cooling fluid between the evaporative cooler LAMEE and the first LAHE. The evaporative cooler LAMEE is configured to utilize the scavenger air stream to evaporatively cool the cooling fluid. The first LAHE is configured to receive the cooling fluid from the evaporative cooler LAMEE and to allow the cooling fluid to absorb heat from the process air stream to cool the process air stream.

28 Claims, 9 Drawing Sheets

(51) Int. Cl.
*F24F 1/005* (2019.01)
*F24F 5/00* (2006.01)
*F24F 12/00* (2006.01)
*F28D 15/00* (2006.01)
*H05K 7/20* (2006.01)
*F24F 3/14* (2006.01)
*F24F 13/30* (2006.01)

(52) U.S. Cl.
CPC ......... *F24F 5/0035* (2013.01); *F24F 12/002* (2013.01); *F28D 15/00* (2013.01); *H05K 7/20827* (2013.01); *F24F 3/1417* (2013.01); *Y02B 30/54* (2013.01); *Y02B 30/56* (2013.01)

(56) References Cited

U.S. PATENT DOCUMENTS

| | | |
|---|---|---|
| 2,290,465 A | 7/1942 | Crawford et al. |
| 2,562,811 A | 7/1951 | Glenn |
| 2,946,201 A | 7/1960 | Munters |
| 2,968,165 A | 1/1961 | Gunnar |
| 3,009,684 A | 11/1961 | Georg |
| 3,018,231 A | 1/1962 | Valentine et al. |
| 3,144,901 A | 8/1964 | Meek |
| 3,247,679 A | 4/1966 | Gershon |
| 3,291,206 A | 12/1966 | Peter |
| 3,401,530 A | 9/1968 | Gershon |
| 3,467,072 A | 9/1969 | Toesca |
| 3,735,559 A | 5/1973 | Salemme |
| 4,011,731 A | 3/1977 | Meckler |
| 4,113,004 A | 9/1978 | Rush et al. |
| 4,180,985 A | 1/1980 | Northrup, Jr. |
| 4,233,796 A | 11/1980 | Mazzoni et al. |
| 4,235,081 A | 11/1980 | Dowling |
| 4,257,169 A | 3/1981 | Pierce |
| 4,259,849 A | 4/1981 | Griffiths |
| 4,373,347 A | 2/1983 | Howell et al. |
| 4,380,910 A * | 4/1983 | Hood .............. F24F 5/0035 62/91 |
| 4,430,864 A | 2/1984 | Mathiprakasam |
| 4,474,021 A | 10/1984 | Harband |
| 4,538,426 A * | 9/1985 | Bock ............... F24F 5/0035 261/147 |
| 4,594,860 A | 6/1986 | Coellner et al. |
| 4,691,530 A | 9/1987 | Meckler |
| 4,700,550 A | 10/1987 | Rhodes |
| 4,719,761 A | 1/1988 | Cromer |
| 4,723,417 A | 2/1988 | Meckler |
| 4,729,428 A | 3/1988 | Yasutake et al. |
| 4,729,774 A | 3/1988 | Cohen et al. |
| 4,841,733 A | 6/1989 | Dussault et al. |
| 4,887,438 A | 12/1989 | Meckler |
| 4,900,448 A | 2/1990 | Bonne et al. |
| 4,905,479 A | 3/1990 | Wilkinson |
| 4,909,810 A | 3/1990 | Nakao et al. |
| 4,930,322 A | 6/1990 | Ashley et al. |
| 4,936,107 A | 6/1990 | Kitagaki et al. |
| 4,939,906 A | 7/1990 | Spatz et al. |
| 4,941,324 A | 7/1990 | Peterson et al. |
| 4,982,575 A | 1/1991 | Besik |
| 5,003,961 A | 4/1991 | Besik |
| 5,020,334 A | 6/1991 | Wilkinson |
| 5,020,335 A | 6/1991 | Albers et al. |
| 5,022,241 A | 6/1991 | Wilkinson |
| 5,120,445 A | 6/1992 | Colman |
| 5,131,238 A | 7/1992 | Meckler |
| 5,148,374 A | 9/1992 | Coellner |
| 5,170,633 A | 12/1992 | Kaplan |
| 5,176,005 A | 1/1993 | Kaplan |
| 5,181,387 A | 1/1993 | Meckler |
| 5,191,771 A | 3/1993 | Meckler |
| 5,297,398 A | 3/1994 | Meckler |
| 5,311,929 A | 5/1994 | Verret |
| 5,325,676 A | 7/1994 | Meckler |
| 5,337,574 A | 8/1994 | Dick |
| 5,351,497 A | 10/1994 | Lowenstein |
| 5,353,606 A | 10/1994 | Yoho et al. |
| 5,373,704 A | 12/1994 | Mcfadden |
| 5,387,376 A | 2/1995 | Gasser |
| 5,448,895 A | 9/1995 | Coellner et al. |
| 5,471,852 A | 12/1995 | Meckler |
| 5,482,625 A | 1/1996 | Shimizu et al. |
| 5,496,397 A | 3/1996 | Fischer et al. |
| 5,502,975 A | 4/1996 | Brickley et al. |
| 5,517,828 A | 5/1996 | Calton et al. |
| 5,526,651 A | 6/1996 | Worek et al. |
| 5,542,968 A | 8/1996 | Belding et al. |
| 5,551,245 A | 9/1996 | Calton et al. |
| 5,564,281 A | 10/1996 | Calton et al. |
| 5,579,647 A * | 12/1996 | Calton ............... F24F 3/1411 62/223 |
| 5,580,369 A | 12/1996 | Belding et al. |
| 5,632,954 A | 5/1997 | Coellner et al. |
| 5,638,900 A | 6/1997 | Lowenstein et al. |
| 5,649,428 A | 7/1997 | Calton et al. |
| 5,650,221 A | 7/1997 | Belding et al. |
| 5,653,115 A | 8/1997 | Brickley et al. |
| 5,660,048 A | 8/1997 | Belding et al. |
| 5,661,983 A | 9/1997 | Groten et al. |
| 5,685,897 A | 11/1997 | Belding et al. |
| 5,701,762 A | 12/1997 | Akamatsu et al. |
| 5,718,286 A | 2/1998 | Damsohn et al. |
| 5,727,394 A | 3/1998 | Belding et al. |
| 5,732,562 A | 3/1998 | Moratalla |
| 5,749,230 A | 5/1998 | Coellner et al. |
| 5,758,508 A | 6/1998 | Belding et al. |
| 5,758,511 A | 6/1998 | Yoho et al. |
| 5,761,915 A | 6/1998 | Rao |
| 5,761,923 A | 6/1998 | Maeda |
| 5,791,153 A | 8/1998 | Belding et al. |
| 5,791,157 A | 8/1998 | Maeda |
| 5,816,065 A | 10/1998 | Maeda |
| 5,825,641 A | 10/1998 | Mangtani |
| 5,826,434 A | 10/1998 | Belding et al. |
| 5,826,641 A | 10/1998 | Bierwirth et al. |
| 5,832,736 A | 11/1998 | Yoshioka et al. |
| 5,860,284 A | 1/1999 | Goland et al. |
| 5,890,372 A | 4/1999 | Belding et al. |
| 5,911,273 A | 6/1999 | Brenner et al. |
| 5,931,016 A | 8/1999 | Yoho |
| 5,943,874 A * | 8/1999 | Maeda ............... F24F 3/1423 62/238.3 |
| 5,946,931 A | 9/1999 | Lomax et al. |
| 5,950,447 A | 9/1999 | Maeda et al. |
| 5,992,160 A | 11/1999 | Bussjager et al. |
| 6,003,327 A | 12/1999 | Belding et al. |
| 6,018,953 A | 2/2000 | Belding et al. |
| 6,018,954 A | 2/2000 | Assaf |
| 6,029,462 A | 2/2000 | Denniston |
| 6,029,467 A * | 2/2000 | Moratalla ............ B01D 53/265 165/8 |
| 6,050,100 A | 4/2000 | Belding et al. |
| 6,079,481 A | 6/2000 | Lowenstein et al. |
| 6,094,835 A | 8/2000 | Cromer |
| 6,138,470 A | 10/2000 | Potnis et al. |
| 6,141,979 A | 11/2000 | Dunlap |
| 6,145,588 A | 11/2000 | Martin et al. |
| 6,156,102 A | 12/2000 | Conrad et al. |
| 6,176,101 B1 | 1/2001 | Lowenstein |
| 6,178,762 B1 | 1/2001 | Flax |
| 6,199,388 B1 | 3/2001 | Fischer |
| 6,199,392 B1 | 3/2001 | Maeda |
| 6,237,354 B1 | 5/2001 | Cromer |
| 6,269,650 B1 | 8/2001 | Shaw |
| 6,318,106 B1 | 11/2001 | Maeda |
| RE37,464 E | 12/2001 | Meckler |
| 6,363,218 B1 | 3/2002 | Lowenstein et al. |
| 6,412,295 B2 | 7/2002 | Weiss et al. |
| 6,442,951 B1 | 9/2002 | Maeda et al. |
| 6,494,053 B1 | 12/2002 | Forkosh |
| 6,497,107 B2 | 12/2002 | Maisotsenko et al. |
| 6,532,763 B1 | 3/2003 | Gupte |
| 6,546,746 B2 | 4/2003 | Forkosh et al. |
| 6,568,466 B2 | 5/2003 | Lowenstein et al. |

(56) References Cited

U.S. PATENT DOCUMENTS

| | | |
|---|---|---|
| 6,575,228 B1 | 6/2003 | Ragland et al. |
| 6,598,862 B2 | 7/2003 | Merrill et al. |
| 6,635,104 B2 | 10/2003 | Komkova et al. |
| 6,644,059 B2 | 11/2003 | Maeda et al. |
| 6,684,649 B1 | 2/2004 | Thompson |
| 6,709,492 B1 | 3/2004 | Spadaccini et al. |
| 6,720,990 B1 | 4/2004 | Walker et al. |
| 6,739,142 B1 | 5/2004 | Korin |
| 6,745,826 B2 | 6/2004 | Lowenstein et al. |
| 6,751,964 B2 | 6/2004 | Fischer |
| 6,800,118 B2 | 10/2004 | Kusunose et al. |
| 6,841,601 B2 | 1/2005 | Serpico et al. |
| 6,848,265 B2 | 2/2005 | Lowenstein et al. |
| 6,854,278 B2 | 2/2005 | Maisotsenko et al. |
| 6,864,005 B2 | 3/2005 | Mossman |
| 6,935,416 B1 | 8/2005 | Tsunoda et al. |
| 6,973,795 B1 | 12/2005 | Moffitt |
| 6,976,365 B2 | 12/2005 | Forkosh et al. |
| 6,978,633 B2 | 12/2005 | Yamazaki |
| 7,000,427 B2 | 2/2006 | Mathias et al. |
| 7,017,356 B2 | 3/2006 | Moffitt |
| 7,092,006 B2 | 8/2006 | Walker et al. |
| 7,093,452 B2 | 8/2006 | Chee et al. |
| 7,093,649 B2 | 8/2006 | Dawson |
| RE39,288 E | 9/2006 | Assaf |
| 7,178,355 B2 | 2/2007 | Moffitt |
| 7,181,918 B2 | 2/2007 | Reinders et al. |
| 7,231,967 B2 | 6/2007 | Haglid |
| 7,269,966 B2 | 9/2007 | Lowenstein et al. |
| 7,306,650 B2 | 12/2007 | Slayzak et al. |
| 7,331,376 B2 | 2/2008 | Gagnon et al. |
| 7,340,906 B2 | 3/2008 | Moffitt |
| 7,389,646 B2 | 6/2008 | Moffitt |
| 7,389,652 B1 * | 6/2008 | Fair ............... F24F 5/0035 62/310 |
| 7,593,033 B2 | 9/2009 | Walker et al. |
| 7,602,414 B2 | 10/2009 | Walker et al. |
| 7,605,840 B2 | 10/2009 | Walker et al. |
| 7,717,404 B2 | 5/2010 | Hasegawa et al. |
| 7,719,565 B2 | 5/2010 | Walker et al. |
| 7,737,224 B2 | 6/2010 | Willis et al. |
| 7,753,991 B2 | 7/2010 | Kertzman |
| 7,781,034 B2 | 8/2010 | Yializis et al. |
| 7,817,182 B2 | 10/2010 | Walker et al. |
| D638,925 S | 5/2011 | Charlebois et al. |
| 7,942,387 B2 | 5/2011 | Forkosh |
| 7,966,841 B2 | 6/2011 | Lowenstein et al. |
| 8,002,023 B2 | 8/2011 | Murayama |
| 8,033,532 B2 | 10/2011 | Yabu |
| 8,137,436 B2 | 3/2012 | Calis et al. |
| 8,157,891 B2 | 4/2012 | Montie et al. |
| 8,318,824 B2 | 11/2012 | Matsuoka et al. |
| 8,550,151 B2 | 10/2013 | Murayama et al. |
| 8,769,971 B2 | 7/2014 | Kozubal et al. |
| 8,783,053 B2 | 7/2014 | McCann |
| 8,887,523 B2 | 11/2014 | Gommed et al. |
| 8,899,061 B2 | 12/2014 | Reytblat |
| 8,915,092 B2 | 12/2014 | Gerber et al. |
| 8,920,699 B2 | 12/2014 | Marutani et al. |
| 8,943,848 B2 | 2/2015 | Phannavong et al. |
| 8,966,924 B2 | 3/2015 | Pichai |
| 9,027,764 B2 | 5/2015 | Murutani et al. |
| 9,109,808 B2 | 8/2015 | Manfred et al. |
| 9,188,349 B2 | 11/2015 | Warmerdam et al. |
| 9,234,665 B2 | 1/2016 | Erb et al. |
| 9,243,810 B2 | 1/2016 | Vandermeulen et al. |
| 9,273,877 B2 | 3/2016 | Vandermeulen |
| 9,429,332 B2 | 8/2016 | Vandermeulen et al. |
| 9,810,439 B2 | 11/2017 | Coutu et al. |
| 9,816,760 B2 | 11/2017 | LePoudre et al. |
| 9,909,768 B2 | 3/2018 | Gerber et al. |
| 2001/0003902 A1 | 6/2001 | Kopko |
| 2002/0005271 A1 | 1/2002 | Weiss et al. |
| 2002/0038552 A1 * | 4/2002 | Maisotsenko ............ F28D 5/02 62/121 |
| 2003/0014983 A1 | 1/2003 | Maisotsenko et al. |
| 2003/0037905 A1 * | 2/2003 | Weng ................ F24F 5/0035 165/60 |
| 2003/0070787 A1 | 4/2003 | Moffitt |
| 2003/0121271 A1 | 7/2003 | Dinnage et al. |
| 2004/0000152 A1 | 1/2004 | Fischer |
| 2004/0061245 A1 | 4/2004 | Maisotsenko et al. |
| 2004/0134211 A1 | 7/2004 | Lee et al. |
| 2004/0134212 A1 | 7/2004 | Lee et al. |
| 2004/0168462 A1 | 9/2004 | Assaf |
| 2004/0226685 A1 | 11/2004 | Gagnon et al. |
| 2005/0056042 A1 * | 3/2005 | Bourne ................ F24F 3/044 62/310 |
| 2005/0072303 A1 | 4/2005 | Weidenmann |
| 2005/0230080 A1 | 10/2005 | Paul |
| 2005/0249901 A1 | 11/2005 | Yializis et al. |
| 2005/0262862 A1 | 12/2005 | Moffitt |
| 2005/0279115 A1 * | 12/2005 | Lee ................. F24F 1/0007 62/314 |
| 2006/0021615 A1 | 2/2006 | Kertzman |
| 2006/0042295 A1 * | 3/2006 | Assaf ................ F24F 3/1417 62/314 |
| 2006/0205301 A1 | 9/2006 | Klare et al. |
| 2007/0029685 A1 | 2/2007 | Lin |
| 2007/0056894 A1 | 3/2007 | Connors, Jr. |
| 2007/0095519 A1 | 5/2007 | Hornbucher |
| 2007/0234743 A1 | 10/2007 | Assaf |
| 2007/0279861 A1 | 12/2007 | Doll et al. |
| 2008/0023182 A1 | 1/2008 | Beamer et al. |
| 2008/0066888 A1 | 3/2008 | Tong et al. |
| 2008/0085437 A1 | 4/2008 | Dean et al. |
| 2008/0099184 A1 | 5/2008 | Han |
| 2008/0283217 A1 | 11/2008 | Gagnon et al. |
| 2009/0095162 A1 | 4/2009 | Hargis et al. |
| 2009/0126913 A1 | 5/2009 | Lee et al. |
| 2009/0133866 A1 | 5/2009 | Campbell et al. |
| 2009/0193974 A1 | 8/2009 | Montie et al. |
| 2009/0294110 A1 | 12/2009 | Foust |
| 2009/0324929 A1 | 12/2009 | Yamakawa et al. |
| 2010/0090356 A1 | 4/2010 | Sines et al. |
| 2010/0170655 A1 | 7/2010 | Kronvall et al. |
| 2010/0170776 A1 | 7/2010 | Ehrenberg et al. |
| 2010/0181062 A1 * | 7/2010 | McCann ............. F24F 5/0035 165/287 |
| 2010/0192605 A1 | 8/2010 | Fang et al. |
| 2010/0200068 A1 | 8/2010 | D'arcy et al. |
| 2010/0275629 A1 | 11/2010 | Erickson |
| 2010/0300123 A1 | 12/2010 | Park et al. |
| 2010/0319370 A1 * | 12/2010 | Kozubal ............. F24F 5/0035 62/92 |
| 2011/0056384 A1 | 3/2011 | Kadota |
| 2011/0192579 A1 | 8/2011 | Sotokawa et al. |
| 2011/0223486 A1 | 9/2011 | Zhang et al. |
| 2011/0232485 A1 | 9/2011 | Ellsworth |
| 2011/0232633 A1 | 9/2011 | Lima |
| 2011/0259572 A1 | 10/2011 | Muratani et al. |
| 2011/0308265 A1 | 12/2011 | Phannavong et al. |
| 2012/0000227 A1 | 1/2012 | Matsuura et al. |
| 2012/0031133 A1 | 2/2012 | Kuwabara et al. |
| 2012/0061045 A1 | 3/2012 | Huizing |
| 2012/0073791 A1 | 3/2012 | Dubois |
| 2012/0085112 A1 | 4/2012 | Wintemute |
| 2012/0106073 A1 | 5/2012 | Wu et al. |
| 2012/0125020 A1 * | 5/2012 | Vandermeulen ....... B01D 53/263 62/94 |
| 2012/0125021 A1 | 5/2012 | Vandermeulen et al. |
| 2012/0125023 A1 | 5/2012 | Kopko et al. |
| 2012/0125031 A1 | 5/2012 | Vandermeulen et al. |
| 2012/0125405 A1 | 5/2012 | Vandermeulen et al. |
| 2012/0125581 A1 | 5/2012 | Allen et al. |
| 2012/0131934 A1 | 5/2012 | Vandermeulen et al. |
| 2012/0131937 A1 | 5/2012 | Vandermeulen et al. |
| 2012/0131938 A1 | 5/2012 | Vandermeulen et al. |
| 2012/0131939 A1 | 5/2012 | Vandermeulen et al. |
| 2012/0131940 A1 | 5/2012 | Vandermeulen et al. |
| 2012/0132513 A1 | 5/2012 | Vandermeulen et al. |
| 2012/0162918 A1 | 6/2012 | Thyni et al. |
| 2012/0168369 A1 | 7/2012 | Van Medevoort et al. |
| 2012/0180505 A1 | 7/2012 | Gerber et al. |

(56) References Cited

U.S. PATENT DOCUMENTS

| | | | |
|---|---|---|---|
| 2012/0186281 A1 | 7/2012 | Vandermeulen et al. |
| 2012/0247132 A1 | 10/2012 | Lakdawala et al. |
| 2012/0298340 A1 | 11/2012 | Al-Otaibi |
| 2013/0056177 A1 | 3/2013 | Coutu et al. |
| 2013/0186121 A1 | 7/2013 | Erb et al. |
| 2013/0199220 A1 | 8/2013 | Ma et al. |
| 2013/0240438 A1 | 9/2013 | Willis et al. |
| 2013/0248147 A1 | 9/2013 | Wintemute et al. |
| 2013/0283837 A1 | 10/2013 | Takahashi et al. |
| 2013/0340449 A1 | 12/2013 | Kozubal et al. |
| 2014/0054004 A1 | 2/2014 | LePoudre et al. |
| 2014/0054013 A1 | 2/2014 | Lepoudre et al. |
| 2014/0083648 A1 | 3/2014 | Wawryk |
| 2014/0190037 A1 | 7/2014 | Erb et al. |
| 2014/0245769 A1 | 9/2014 | Vandermeulen et al. |
| 2014/0260367 A1* | 9/2014 | Coutu .................. F24F 3/1417 62/89 |
| 2014/0260373 A1 | 9/2014 | Gerber et al. |
| 2014/0260399 A1 | 9/2014 | Vandermeulen |
| 2014/0262125 A1 | 9/2014 | Erb et al. |
| 2014/0262144 A1 | 9/2014 | Erb et al. |
| 2014/0326433 A1 | 11/2014 | Kozubal |
| 2015/0096714 A1 | 4/2015 | Dagley |
| 2015/0184876 A1 | 7/2015 | Vandermeulen et al. |
| 2015/0292754 A1 | 10/2015 | Mongar |
| 2015/0323203 A1 | 11/2015 | Gerber et al. |
| 2016/0054012 A1 | 2/2016 | Lepoudre et al. |
| 2016/0084512 A1 | 3/2016 | Blake et al. |
| 2016/0018701 A1 | 6/2016 | Vandermeulen |
| 2016/0290666 A1 | 10/2016 | Coutu et al. |
| 2016/0298865 A1 | 10/2016 | Gerber et al. |
| 2016/0327345 A1 | 11/2016 | Lowenstein |
| 2017/0241655 A1 | 8/2017 | Lepoudre et al. |
| 2018/0073753 A1 | 3/2018 | Lepoudre et al. |
| 2018/0012851 A1 | 5/2018 | Lepoudre et al. |
| 2018/0135880 A1 | 5/2018 | Ghadiri Moghaddam et al. |
| 2018/0187918 A1 | 7/2018 | Lepoudre et al. |

FOREIGN PATENT DOCUMENTS

| | | |
|---|---|---|
| AU | 2015230799 B2 | 3/2018 |
| AU | 2013305427 B2 | 4/2018 |
| AU | 2014231681 B2 | 6/2018 |
| AU | 2013305428 B2 | 9/2018 |
| CA | 2283089 A1 | 11/2000 |
| CA | 2801352 A | 12/2011 |
| CA | 2801352 A1 | 12/2011 |
| CA | 2798928 A1 | 2/2012 |
| CA | 2843763 A1 | 3/2013 |
| CA | 2904224 A1 | 9/2014 |
| CH | 193732 A | 10/1937 |
| CN | 1163389 A | 10/1997 |
| CN | 1343292 A | 4/2002 |
| CN | 1456855 A | 11/2003 |
| CN | 1517610 A | 8/2004 |
| CN | 1518477 A | 8/2004 |
| CN | 1666081 A | 9/2005 |
| CN | 1711448 A | 12/2005 |
| CN | 200958820 Y | 10/2007 |
| CN | 101405559 A | 4/2009 |
| CN | 101421580 A | 4/2009 |
| CN | 101469090 A | 7/2009 |
| CN | 101918777 A | 12/2010 |
| CN | 102076401 A | 5/2011 |
| CN | 201906567 U | 7/2011 |
| CN | 102165268 A | 8/2011 |
| CN | 102232015 A | 11/2011 |
| CN | 102345909 A | 2/2012 |
| CN | 102395419 A | 3/2012 |
| CN | 102548727 A | 7/2012 |
| CN | 102549361 A | 7/2012 |
| CN | 102933931 A | 2/2013 |
| CN | 103069246 A | 4/2013 |
| CN | 103827595 A | 5/2014 |
| CN | 104583706 A | 4/2015 |
| CN | 105121989 A | 12/2015 |
| CN | 105164474 A | 12/2015 |
| CN | 105202795 A | 12/2015 |
| CN | 105283715 A | 1/2016 |
| CN | 101512238 A | 8/2016 |
| CN | 105164484 B | 6/2017 |
| CN | 105121989 B | 9/2017 |
| CN | 107249715 A | 10/2017 |
| CN | 107300230 A | 10/2017 |
| CN | 107560482 A | 1/2018 |
| CN | 107850335 A | 3/2018 |
| CN | 107923647 A | 4/2018 |
| CN | 108027221 A | 5/2018 |
| DE | 10143092 A1 | 3/2003 |
| EP | 0448991 A2 | 10/1991 |
| EP | 0661502 A2 | 7/1995 |
| EP | 0678321 A2 | 10/1995 |
| EP | 1108575 A1 | 6/2001 |
| EP | 2397787 A2 | 12/2011 |
| EP | 2751493 B1 | 3/2018 |
| FR | 2291457 A1 | 6/1976 |
| GB | 1354502 A | 6/1974 |
| GB | 2015384 A | 9/1979 |
| IN | 201717044889 A | 3/2018 |
| IN | 201717044890 A | 3/2018 |
| IN | 201817002765 A | 4/2018 |
| JP | 61-52594 A | 3/1986 |
| JP | 05-157282 A | 6/1993 |
| JP | 09-196482 A | 7/1997 |
| JP | 10-170177 A | 6/1998 |
| JP | 2004116419 A | 4/2004 |
| JP | 2004-257588 A | 9/2004 |
| JP | 2008-070046 A | 3/2008 |
| JP | 2009-275955 A | 11/2009 |
| TW | I271499 B | 1/2007 |
| WO | WO-96/041107 A1 | 12/1996 |
| WO | WO-99/014535 A1 | 3/1999 |
| WO | WO-01/35039 A1 | 5/2001 |
| WO | WO-01/71260 A1 | 9/2001 |
| WO | WO-03/049835 A1 | 6/2003 |
| WO | WO-2004/065875 A1 | 8/2004 |
| WO | WO-2008/037079 A1 | 4/2008 |
| WO | WO-2008/053367 A2 | 5/2008 |
| WO | WO-2008/089484 A1 | 7/2008 |
| WO | WO-2009/000974 A1 | 12/2008 |
| WO | WO2009/094032 | 7/2009 |
| WO | WO-2009/158030 A1 | 12/2009 |
| WO | WO-2010006968 A1 | 1/2010 |
| WO | WO-2011/062808 A1 | 5/2011 |
| WO | WO-2011/161547 A2 | 12/2011 |
| WO | WO-2012/018089 A1 | 2/2012 |
| WO | WO-2012/042553 A1 | 4/2012 |
| WO | WO-2012/087273 A1 | 6/2012 |
| WO | WO-2012/097445 A1 | 7/2012 |
| WO | WO-2012/167366 A1 | 12/2012 |
| WO | WO-2013/029148 A1 | 3/2013 |
| WO | WO-2013/094206 A1 | 6/2013 |
| WO | WO-2013/107554 A1 | 7/2013 |
| WO | WO-2013/192397 A1 | 12/2013 |
| WO | WO-2014/029003 A1 | 12/2013 |
| WO | WO-2014/029004 A1 | 2/2014 |
| WO | WO-2014/107790 A1 | 7/2014 |
| WO | WO-2014/138846 A1 | 9/2014 |
| WO | WO-2014/138847 A1 | 9/2014 |
| WO | WO-2014/138859 A1 | 9/2014 |
| WO | WO-2014/138860 A1 | 9/2014 |
| WO | WO-2016/026042 A1 | 2/2016 |
| WO | WO-2016/183667 A1 | 11/2016 |
| WO | WO-2016/183668 A1 | 11/2016 |
| WO | WO-2016/207864 A1 | 12/2016 |
| WO | WO-2017152268 A1 | 9/2017 |

OTHER PUBLICATIONS

International Search Report and Written Opinion for counterpart application PCT/CA2014/000148.

(56) References Cited

OTHER PUBLICATIONS

J. Woods and E. Kozubal, Desiccant Enhanced Evaporative Air Conditioning: Parametric Analysis and Design, Presented at the Second International Conference on Building Energy and Environment (COBEE2012),Boulder, CO, Aug. 1-4, 2012, Conference Paper NREL/CP-5500-54087, Oct. 2012, (10) pgs.
"Chinese Application Serial No. 201480015766.5, Office Action dated Oct. 19, 2016", (w/English Translation), 9 pgs.
"European Application Serial No. 14764192.2, Extended European Search Report dated Oct. 27, 2016", 7 pgs.
"European Application Serial No. 14764192.2, Response filed Apr. 13, 2016 to Communication Pursuant Rules 161(2) and 162 EPC dated Nov. 19, 2015", 9 pgs.
"AAONAIRE Energy Recovery Units Users Information Manual", (Aug. 2006), 16 pgs.
"AAONAIRE(r) Energy Recovery Units Users Information Manual", R86610 (Rev. A 8-06), (Aug. 2006), 16 pgs.
"Advances in Desiccant-Based Dehumidification", (C) 2005 American Standard, TRANE Engineers Newsletter; vol. 34-4, (2005), 1-8.
"U.S. Appl. No. 10/048,797, Amendment and Response filed Apr. 29, 2003 to Non-Final Office dated Mar. 11, 2003", 10 pgs.
"U.S. Appl. No. 10/048,797, Non-Final Office dated Mar. 11, 2003", 4 pgs.
"U.S. Appl. No. 10/048,797, Notice of Allowance dated May 13, 2003", 5 pgs.
"U.S. Appl. No. 13/350,902, Appeal Brief filed Apr. 4, 2014", 24 pgs.
"U.S. Appl. No. 13/350,902, Appeal Decision mailed Sep. 30, 2016", 6 pgs.
"U.S. Appl. No. 13/350,902, Examiner's Answer dated Jun. 16, 2014", 17 pgs.
"U.S. Appl. No. 13/350,902, Final Office Action dated Dec. 30, 2013", 13 pgs.
"U.S. Appl. No. 13/350,902, Non Final Office Action dated Oct. 1, 2013", 13 pgs.
"U.S. Appl. No. 13/350,902, Notice of Allowance dated Nov. 9, 2016", 9 pgs.
"U.S. Appl. No. 13/350,902, Reply Brief filed Jul. 8, 2014", 9 pgs.
"U.S. Appl. No. 13/350,902, Response filed Aug. 5, 2013 to Restriction Requirement dated Jul. 23, 2013", 2 pgs.
"U.S. Appl. No. 13/350,902, Response filed Oct. 29, 2013 to Non Final Office Action dated Oct. 1, 2013", 15 pgs.
"U.S. Appl. No. 13/350,902, Restriction Requirement dated Jul. 23, 2013", 8 pgs.
"U.S. Appl. No. 13/449,598, Final Office Action dated Feb. 4, 2016", 23 pgs.
"U.S. Appl. No. 13/449,598, Non Final Office Action dated Apr. 24, 2015", 18 pgs.
"U.S. Appl. No. 13/449,598, Non Final Office Action dated Aug. 27, 2015", 20 pgs.
"U.S. Appl. No. 13/449,598, Notice of Allowance dated Mar. 10, 2017", 7 pgs.
"U.S. Appl. No. 13/449,598, Notice of Allowance dated Nov. 4, 2016", 9 pgs.
"U.S. Appl. No. 13/449,598, Response filed Jan. 29, 2015 to Restriction Requirement dated Jan. 5, 2015", 2 pgs.
"U.S. Appl. No. 13/449,598, Response filed Jul. 17, 2015 to Non Final Office Action dated Apr. 24, 2015", 17 pgs.
"U.S. Appl. No. 13/449,598, Response filed Nov. 16, 2015 to Non Final Office Action dated Aug. 27, 2015", 18 pgs.
"U.S. Appl. No. 13/449,598, Restriction Requirement dated Jan. 5, 2015", 10 pgs.
"U.S. Appl. No. 13/702,596, Appeal Brief filed Jun. 15, 2015", 82 pgs.
"U.S. Appl. No. 13/702,596, Final Office Action dated Jan. 30, 2015", 15 pgs.
"U.S. Appl. No. 13/702,596, Non Final Office Action dated Oct. 30, 2014", 16 pgs.
"U.S. Appl. No. 13/702,596, Notice of Allowance dated Oct. 1, 2015", 7 pgs.

"U.S. Appl. No. 13/702,596, Notice of Allowance dated Nov. 25, 2015", 2 pgs.
"U.S. Appl. No. 13/702,596, Post Allowance Amendment filed Oct. 7, 2015", 13 pgs.
"U.S. Appl. No. 13/702,596, PTO Response to Rule 312 Communication dated Oct. 19, 2015", 2 pgs.
"U.S. Appl. No. 13/702,596, Response filed Dec. 15, 2014 to Non Final Office Action dated Oct. 30, 2014", 21 pgs.
"U.S. Appl. No. 13/797,062, Appeal Brief filed Jun. 9, 2016", 33 pgs.
"U.S. Appl. No. 13/797,062, Final Office Action dated Feb. 24, 2016", 29 pgs.
"U.S. Appl. No. 13/797,062, Non Final Office Action dated May 7, 2015", 19 pgs.
"U.S. Appl. No. 13/797,062, Non Final Office Action dated Sep. 25, 2015", 24 pgs.
"U.S. Appl. No. 13/797,062, Response filed Apr. 23, 2015 to Restriction Requirement dated Mar. 13, 2015", 3 pgs.
"U.S. Appl. No. 13/797,062, Response filed Jul. 17, 2015 to Non Final Office Action dated May 7, 2015", 16 pgs.
"U.S. Appl. No. 13/797,062, Response filed Nov. 30, 2015 to Non Final Office Action dated Sep. 25, 2015", 16 pgs.
"U.S. Appl. No. 13/797,062, Restriction Requirement dated Mar. 13, 2015", 8 pgs.
"U.S. Appl. No. 13/797,152, Appeal Brief filed Jun. 9, 2016", 29 pgs.
"U.S. Appl. No. 13/797,152, Corrected Notice of Allowance dated Mar. 9, 2017", 7 pgs.
"U.S. Appl. No. 13/797,152, Final Office Action dated Feb. 25, 2016", 14 pgs.
"U.S. Appl. No. 13/797,152, Non Final Office Action dated Aug. 25, 2015", 10 pgs.
"U.S. Appl. No. 13/797,152, Notice of Allowance dated Mar. 9, 2017", 7 pgs.
"U.S. Appl. No. 13/797,152, Notice of Allowance dated Oct. 31, 2016", 7 pgs.
"U.S. Appl. No. 13/797,152, Response filed Nov. 20, 2015 to Non Final Office Action dated Aug. 25, 2015", 12 pgs.
"U.S. Appl. No. 13/801,280, 312 Amendment filed Jun. 18, 2015", 8 pgs.
"U.S. Appl. No. 13/801,280, Non Final Office Action dated Feb. 12, 2015", 7 pgs.
"U.S. Appl. No. 13/801,280, Notice of Allowance dated May 19, 2015", 7 pgs.
"U.S. Appl. No. 13/801,280, PTO Response to 312 Amendment dated Jul. 9, 2015", 2 pgs.
"U.S. Appl. No. 13/801,280, Response filed Jan. 7, 2015 to Restriction Requirement dated Dec. 10, 2014", 1 pg.
"U.S. Appl. No. 13/801,280, Response filed Mar. 31, 2015 to Non Final Office Action dated Feb. 12, 2015", 9 pgs.
"U.S. Appl. No. 13/801,280, Restriction Requirement dated Dec. 10, 2014", 9 pgs.
"U.S. Appl. No. 14/171,951, Advisory Action dated Nov. 10, 2016", 3 pgs.
"U.S. Appl. No. 14/171,951, Final Office Action dated Jun. 28, 2016", 36 pgs.
"U.S. Appl. No. 14/171,951, Non Final Office Action dated Jan. 5, 2016", 20 pgs.
"U.S. Appl. No. 14/171,951, Non Final Office Action dated May 2, 2016", 35 pgs.
"U.S. Appl. No. 14/171,951, Notice of Allowance dated Feb. 3, 2017", 5 pgs.
"U.S. Appl. No. 14/171,951, Response filed Mar. 28, 2016 to Non Final Office Action dated Jan. 5, 2016", 18 pgs.
"U.S. Appl. No. 14/171,951, Response filed Jun. 9, 2016 to Non Final Office Action dated May 2, 2016", 24 pgs.
"U.S. Appl. No. 14/171,951, Response filed Oct. 28, 2016 to Final Office Action dated Jun. 28, 2016", 15 pgs.
"U.S. Appl. No. 14/171,951, Response filed Dec. 3, 2015 to Restriction Requirement dated Nov. 16, 2015", 6 pgs.
"U.S. Appl. No. 14/171,951, Response filed Dec. 15, 2016 to Advisory Action dated Nov. 10, 2016", 16 pgs.

(56) References Cited

OTHER PUBLICATIONS

"U.S. Appl. No. 14/171,951, Restriction Requirement dated Nov. 16, 2015", 13 pgs.
"U.S. Appl. No. 14/186,420, Notice of Allowance dated Jan. 27, 2017", 7 pgs.
"U.S. Appl. No. 14/190,715, Restriction Requirement dated Apr. 13, 2017", 7 pgs.
"U.S. Appl. No. 14/192,019, Non Final Office Action dated May 19, 2017", 15 pgs.
"U.S. Appl. No. 14/804,953, Non Final Office Action dated Sep. 15, 2016", 8 pgs.
"U.S. Appl. No. 14/804,953, Notice of Allowance dated Feb. 27, 2017", 7 pgs.
"U.S. Appl. No. 14/804,953, Notice of Allowance dated May 9, 2017", 7 pgs.
"U.S. Appl. No. 14/804,953, Response filed Dec. 15, 2016 to Non Final Office Action dated Sep. 15, 2016", 7 pgs.
"U.S. Appl. No. 14/957,795, Non Final Office Action dated Apr. 3, 2017", 19 pgs.
"Ashrae Technical Committee", Meeting Programs, (Jan. 29, 1997), 13 pgs.
"Australian Application Serial No. 2011268661, First Examiner Report dated Sep. 24, 2014", 5 pgs.
"Australian Application Serial No. 2011268661, Response filed Jul. 20, 2015 to First Examiner Report dated Sep. 24, 2014", 8 pgs.
"Australian Application Serial No. 2011268661, Response filed Sep. 23, 2015 to Second Examiner Report dated Aug. 18, 2015", 5 pgs.
"Australian Application Serial No. 2011268661, Second Examiner Report dated Aug. 18, 2015", 6 pgs.
"Australian Application Serial No. 2012208921, First Examiner Report dated Jun. 2, 2016", 7 pgs.
"Australian Application Serial No. 2012304223, First Examiner Report dated Aug. 5, 2016", 4 pgs.
"Australian Application Serial No. 2012304223, Response filed Feb. 16, 2017 to First Examiner Report dated Aug. 5, 2016", 25 pgs.
"Australian Application Serial No. 2013305427, Examination Report dated Mar. 3, 2017", 4 pgs.
"Australian Application Serial No. 2015230799, First Examiner Report dated Mar. 27, 2017", 10 pgs.
"Canadian Application Serial No. 2,801,352, Office Action dated Aug. 15, 2016", 3 pgs.
"Canadian Application Serial No. 2,801,352, Response filed Feb. 8, 2017 to Office Action dated Aug. 15, 2016", 89 pgs.
"Canadian Application Serial No. 2,843,763, Office Action dated Dec. 4, 2014", 3 pgs.
"Canadian Application Serial No. 2,843,763, Response filed May 12, 2015 to Office Action dated Dec. 4, 2014", 31 pgs.
"Canadian Application Serial No. 2,901,483, Office Action dated Nov. 23, 2016", 4 pgs.
"Chapter 8—Heating, Ventilating, and Air Conditioning (HVAC) Demonstration", HVAC Demonstration, (published prior to Feb. 21, 2014), 16 pgs.
"Chinese Application Serial No. 201280006006.9, Office Action dated Feb. 2, 2016", (w/ English Summary), 19 pgs.
"Chinese Application Serial No. 201280006006.9, Response filed Apr. 8, 2016 to Office Action dated Feb. 2, 2016", (w/ English Translation of Claims), 64 pgs.
"Chinese Application Serial No. 201280006006.9, Voluntary Amendment filed Apr. 14, 2014", 61 pgs.
"Chinese Application Serial No. 201180031103.9, Office Action dated Feb. 11, 2015", (w/ English Translation), 16 pgs.
"Chinese Application Serial No. 201180031103.9, Office Action dated Jun. 13, 2014", (w/ English Translation), 19 pgs.
"Chinese Application Serial No. 201180031103.9, Office Action dated Sep. 9, 2015", (w/ English Translation), 3 pgs.
"Chinese Application Serial No. 201180031103.9, Office Action dated Nov. 6, 2015", (w/ English Translation), 5 pgs.
"Chinese Application Serial No. 201180031103.9, Response filed Apr. 27, 2015 to Office Action dated Feb. 11, 2015", (w/ English Translation), 15 pgs.
"Chinese Application Serial No. 201180031103.9, Response filed Sep. 26, 2014 to Office Action dated Jun. 13, 2014", (w/ English Translation), 12 pgs
"Chinese Application Serial No. 201180031103.9, Response filed Sep. 29, 2015 to Office Action dated Sep. 9, 2015", (w/ English Translation), 78 pgs.
"Chinese Application Serial No. 201280006006.9, Office Action dated May 13, 2015", 3 pgs.
"Chinese Application Serial No. 201280006006.9, Office Action dated Aug. 15, 2016", (English Translation), 18 pgs.
"Chinese Application Serial No. 201280006006.9, Response filed Sep. 28, 2015 to Office Action dated May 13, 2015", (w/ English Translation of Claims), 71 pgs.
"Chinese Application Serial No. 201280006006.9, Response filed Dec. 30, 2016 to Office Action dated Aug. 15, 2016", (w/ English Translation of Claims), 69 pgs.
"Chinese Application Serial No. 201280042778.8, Office Action dated Feb. 3, 2016", (w/ English Translation), 9 pgs.
"Chinese Application Serial No. 201280042778.8, Office Action dated Sep. 7, 2016", 3 pgs.
"Chinese Application Serial No. 201280042778.8, Response filed May 25, 2016 to Office Action dated Feb. 3, 2016", Without English Translation of Claims, 46 pgs.
"Chinese Application Serial No. 201280042778.8, Response filed Nov. 16, 2016 to Office Action dated Sep. 7, 2016", Without English Translation of Claims, 43 pgs.
"Chinese Application Serial No. 201380042926.0, Office Action dated Feb. 26, 2016", (w/ English Translation), 15 pgs.
"Chinese Application Serial No. 201380042926.0, Office Action dated May 11, 2017", (w/ English Translation), 13 pgs.
"Chinese Application Serial No. 201380042926.0, Office Action dated Sep. 28, 2016", (w/ English Translation), 12 pgs.
"Chinese Application Serial No. 201380042926.0, Response filed Feb. 13, 2017 to Office Action dated Sep. 28, 2016", (w/ English Translation of Amended Claims), 56 pgs.
"Chinese Application Serial No. 201380042926.0, Response filed Jul. 7, 2016 to Office Action dated Feb. 26, 2016", (w/ English Translation of Claims), 40 pgs.
"Chinese Application Serial No. 201380044484.3, Office Action dated Jan. 13, 2017", (w/ English Translation), 16 pgs.
"Chinese Application Serial No. 201380044484.3, Office Action dated Mar. 28, 2016", (w/ English Translation), 16 pgs.
"Chinese Application Serial No. 201380044484.3, Response filed Mar. 28, 2017 to Office Action dated Jan. 13, 2017", (w/ English Translation of Claims), 58 pgs.
"Chinese Application Serial No. 201380044484.3, Response filed Oct. 12, 2016 to Office Action dated Mar. 28, 2016", (w/ English Translation of Claims), 54 pgs.
"Chinese Application Serial No. 201480015355.6, Office Action dated Nov. 28, 2016", (w/ English Translation), 16 pgs.
"Chinese Application Serial No. 201480015422.4, Office Action dated Nov. 1, 2016", (w/ English Translation), 13 pgs.
"Chinese Application Serial No. 201480015766.5, Response filed Jan. 20, 2017 to Office Action dated Oct. 19, 2016", (w/ English Translation of Claims), 52 pgs.
"Dehumidification Solutions", Des Champs Laboratories, Inc., (2001), 18 pgs.
"Desi-Wringer™ Precision Desiccant Dehumidification Systems", Des Champs Technologies, (2007), 12 pgs.
"Energy Recovery—Fresh In Air Quality", SEMCO Inc., (published before Apr. 12, 2012), 131 pgs.
"European Application Serial No. 11797695.1, Extended European Search Report dated Jan. 25, 2016", 11 pgs.
"European Application Serial No. 11797695.1, Partial Supplementary European Search Report dated Oct. 7, 2015", 6 pgs.
"European Application Serial No. 11797695.1, Response filed Aug. 22, 2016 to Office Action dated Feb. 11, 2016", 9 pgs.
"European Application Serial No. 12736074.1, Extended European Search Report dated Jul. 13, 2015", 8 pgs.

(56) References Cited

OTHER PUBLICATIONS

"European Application Serial No. 12736074.1, Response filed Oct. 2, 2015 to Extended European Search Report dated Jul. 13, 2015", 10 pgs.
"European Application Serial No. 12827918.9, Extended European Search Report dated Jul. 6, 2015", 6 pgs.
"European Application Serial No. 12827918.9, Response filed Sep. 28, 2015 to Extended European Search Report dated Jul. 6, 2015", 8 pgs.
"European Application Serial No. 13830357.3, Extended European Search Report dated Jun. 8, 2016", 5 pgs.
"European Application Serial No. 13830357.3, Response filed Dec. 23, 2016 to Extended European Search Report dated Jun. 8, 2016", 11 pgs.
"European Application Serial No. 13830940.6, Extended European Search Report dated Jul. 4, 2016", 5 pgs.
"European Application Serial No. 13830940.6, Response filed Jan. 16, 2017 to Communication Pursuant to Rules 70(2) and 70a(2) EPC dated Jul. 21, 2016", 1 pg.
"European Application Serial No. 14764192.2, Response filed Jan. 30, 2017 to Extended European Search Report dated Oct. 27, 2016", 19 pgs.
"European Application Serial No. 14764305.0, Extended European Search Report dated Apr. 4, 2017", 8 pgs.
"European Application Serial No. 14764305.0, Response filed Apr. 13, 2016 to Communication Pursuant to Article 94(3) EPC dated Oct. 8, 2015", 10 pgs.
"European Application Serial No. 14764318.3, Extended European Search Report dated Mar. 15, 2017", 10 pgs.
"European Application Serial No. 14764318.3, Response filed Jan. 28, 2016 to Communication pursuant to Rules 161(1) and 162 EPC dated Nov. 19, 2015", 17 pgs.
"European Application Serial No. 14764713.5, Extended European Search Report dated Dec. 9, 2016", 6 pgs.
"European Application Serial No. 14764713.5, Response filed Jan. 28, 2016 to Communication pursuant to Rules 161(1) and 162 EPC dated Dec. 2, 2015", 9 pgs.
"European Application Serial No. 14765396.8, Extended European Search Report dated Oct. 28, 2016", 6 pgs.
"European Application Serial No. 14765396.8, Office Action dated Nov. 20, 2015", 2 pgs.
"European Application Serial No. 14765396.8, Response filed Jan. 29, 2016 to Office Action dated Nov. 20, 2015", 12 pgs.
"European Application Serial No. 14765396.8, Response filed May 25, 2017 to Extended European Search Report dated Oct. 28, 2016", 5 pgs.
"International Application Serial No. PCT/CA2012/000055, International Preliminary Report on Patentability dated Aug. 1, 2013", 9 pgs.
"International Application Serial No. PCT/CA2012/000055, International Search Report dated May 24, 2012", 4 pgs.
"International Application Serial No. PCT/CA2012/000055, Invitation to Pay Add'l Fees and Partial Search Report dated Mar. 23, 2012", 2 pgs.
"International Application Serial No. PCT/CA2012/000055, Written Opinion dated May 24, 2012", 7 pgs.
"International Application Serial No. PCT/CA2012/000749, International Search Report dated Oct. 26, 2012", 3 pgs.
"International Application Serial No. PCT/CA2012/000749, Written Opinion dated Oct. 26, 2012", 5 pgs.
"International Application Serial No. PCT/CA2013/000608, International Preliminary Report on Patentability dated Mar. 5, 2015", 7 pgs.
"International Application Serial No. PCT/CA2013/000608, International Search Report dated Sep. 23, 2013", 3 pgs.
"International Application Serial No. PCT/CA2013/000608, Written Opinion dated Sep. 23, 2013", 5 pgs.
"International Application Serial No. PCT/CA2013/000609, International Preliminary Report on Patentability dated Mar. 5, 2015", 7 pgs.
"International Application Serial No. PCT/CA2013/000609, International Search Report dated Sep. 17, 2013", 3 pgs.
"International Application Serial No. PCT/CA2013/000609, Written Opinion dated Sep. 17, 2013", 5 pgs.
"International Application Serial No. PCT/CA2013/000964, International Search Report dated Feb. 7, 2014", 3 pgs.
"International Application Serial No. PCT/CA2013/000964, Written Opinion dated Feb. 7, 2014", 6 pgs.
"International Application Serial No. PCT/CA2014/000048, International Preliminary Report on Patentability dated Sep. 24, 2015", 8 pgs.
"International Application Serial No. PCT/CA2014/000048, International Search Report dated Apr. 29, 2014", 3 pgs.
"International Application Serial No. PCT/CA2014/000048, Written Opinion dated Apr. 29, 2014", 6 pgs.
"International Application Serial No. PCT/CA2014/000083, International Preliminary Report on Patentability dated Sep. 24, 2015", 9 pgs.
"International Application Serial No. PCT/CA2014/000083, International Search Report dated May 14, 2014", 3 pgs.
"International Application Serial No. PCT/CA2014/000083, Written Opinion dated May 14, 2014", 7 pgs.
"International Application Serial No. PCT/CA2014/000148, International Preliminary Report on Patentability dated Sep. 24, 2015", 5 pgs.
"International Application Serial No. PCT/CA2014/000169, International Preliminary Report on Patentability dated Sep. 24, 2015", 8 pgs.
"International Application Serial No. PCT/CA2014/000169, International Search Report dated May 27, 2014", 3 pgs.
"International Application Serial No. PCT/CA2014/000169, Written Opinion dated May 27, 2014", 6 pgs.
"International Application Serial No. PCT/CA2014/000171, International Preliminary Report on Patentability dated Sep. 24, 2015", 7 pgs.
"International Application Serial No. PCT/CA2014/000171, International Search Report dated May 27, 2014", 3 pgs.
"International Application Serial No. PCT/CA2014/000171, Written Opinion dated May 27, 2014", 5 pgs.
"International Application Serial No. PCT/CA2015/050787, International Search Report dated Nov. 4, 2015", 3 pgs.
"International Application Serial No. PCT/CA2015/050787, Written Opinion dated Nov. 4, 2015", 3 pgs.
"International Application Serial No. PCT/CA2016/050252, International Search Report dated May 26, 2016", 3 pgs.
"International Application Serial No. PCT/CA2016/050252, Written Opinion dated May 26, 2016", 4 pgs.
"International Application Serial No. PCT/CA2016/050507, International Search Report dated Jul. 21, 2016", 3 pgs.
"International Application Serial No. PCT/CA2016/050507, Written Opinion dated Jul. 21, 2016", 3 pgs.
"International Application Serial No. PCT/CA2017/050180, International Search Report dated Apr. 26, 2017", 3 pgs.
"International Application Serial No. PCT/CA2017/050180, Written Opinion dated Apr. 26, 2017", 4 pgs.
"International Application Serial No. PCT/IB2011/002145, International Preliminary Report on Patentability dated Jan. 10, 2013", 13 pgs.
"International Application Serial No. PCT/IB2011/002145, International Search Report dated Feb. 15, 2012", 7 pgs.
"International Application Serial No. PCT/IB2011/002145, Written Opinion dated Feb. 15, 2012", 11 pgs.
"International Application Serial No. PCT/IB2016/053799, International Search Report dated Aug. 26, 2016", 3 pgs.
"International Application Serial No. PCT/IB2016/053799, Written Opinion dated Aug. 26, 2016", 6 pgs.
"International Application Serial No. PCT/US00/02956, International Preliminary Report on Patentability dated Jul. 9, 2001", 3 pgs.
"International Application Serial No. PCT/US00/02956, International Search Report dated Nov. 8, 2000", 1 pg.
"Plane plate membrane contactor prototypes", University of Genoa, (Published prior to Mar. 28, 2013), 1 pg.

(56) References Cited

OTHER PUBLICATIONS

"Two-Wheel Desiccant Dehumidification System—Technology for Dehumidification and Improving Indoor Air Quality", Federal Technology Alert, (Apr. 1997), 24 pgs.

Abdel-Salam, Mohamed R. H., et al., "Experimental Study of Effects of Phase-Change Energy and Operating Parameters on Performances of Two-Fluid and Three-Fluid Liquid-to-Air Membrane Energy Exchangers", ASHRAE Transactions, vol. 122, Part 1, (Jan. 2016), 134-145.

Abdel-Salam, Mohamed R. H., et al., "Performance testing of 2-fluid and 3-fluid liquid-to-air membrane energy exchangers for HVAC applications in cold-dry climates", International Journal of Heat and Mass Transfer, 106, (2017), 558-569.

Abdel-Salam, Mohamed R. H., et al., "Performance testing of a novel 3-fluid liquid-to-air membrane energy exchanger (3-fluid LAMEE) under desiccant solution regeneration operating conditions", International Journal of Heat and Mass Transfer, 95, (2015), 773-786.

Acker, William, "Industrial Dehumidification: Water Vapor Load Calculations and System Descriptions", HPAC Heatina/Piping/Air Conditioning, (Mar. 1999), 49-59.

Bellia, L., et al., "Air Conditioning Systems With Desiccant Wheel for Italian Climates", International Journal on Architectural Science vol. 1 No. 4, (2000), 193-213.

Bergero, Stefano, et al., "On the performances of a hybrid air-conditioning system in different climatic conditions", Energy 36(8), (2011), 5261-5273.

Bergero, Stefano, et al., "Performance analysis of a liquid desiccant and membrane contactor hybrid air-conditioning system", Bergero, Chiari, Energy and Buildings, (2010), 11 pgs.

Chant, Eileen E., et al., "A Steady-State Simulation of an Advanced Desiccant-Enhanced Cooling and Dehumidification System", ASHRAE Transactions: Research, (Jul. 1992), 339-347.

Coad, William J., "Conditioning Ventilation Air for Improved Performance and Air Quality", HPAC Heating/Piping/Air Conditioning, (Sep. 1999), 6 pgs.

Diblasio, Robert, "Desicants in Hospitals—Conditioning a Research Facility", DiBlasio Engineered Systems, (Sep. 1995), 4 pgs.

Downing, et al., "Operation and Maintenance for Quality Indoor Air", Proceedings of the 7th Symposium on Improving Building Systems in Hot and Humid Climates, Ft. Worth, TX, (Oct. 9, 1990), 5 pgs.

Downing, Chris, "Humidity Controy—No Place Like Home", Engineered Systems, (1996), 4 pgs.

Erb, Blake, et al., "Experimental Measurements of a Run-Around Membrane Energy Exchanger (RAMEE) with Comparison to a Numerical Model", ASHRAE Transactions, (2009), 689-705.

Fischer, J., et al., "Active Desiccant Dehumidification Module Integration With Rooftop Packaged HVAC Units—Final Report Phase 3B", Oak Ridge National Laboratory, (Mar. 2002), 36 pgs.

Fischer, John C., "Optimizing IAQ, Humidity Control, and Energy Efficiency in School Environments Through The Application of Desiccant-Based Total Energy Recovery Systems", IAQ '96. Atlanta: Paths to Better Building Environments/Environmental Effects on Heath and Productivity, (1996), 179-194.

Harriman, III, et al., "Dehumidification and Cooling Loads From Ventilation Air", ASHRAE Journal, (Nov. 1997), 7 pgs.

Harriman, III, et al., "Evaluating Active Desiccant Systems For Ventilating Commercial Buildings", ASHRAE Journal, (Oct. 1999), 7 pgs.

Harriman, III, et al., "New Weather Data For Energy Calculations", ASHRAE Journal, (Mar. 1999), 7 pgs.

Jeong, et al., "Energy Conservation Benefits of a Dedicated Outdoor Air System with Parallel Sensible Cooling By Ceiling Radiant Panels", ASHRAE Transactions; vol. 109—Part 2, (2003), 10 pgs.

Karniadakis, George E., et al., "Mimimum-dissipation transport enhancement by flow destabilization: Reynolds' analogy revisited", J. Fluid Mech vol. 192, (1988), 365-391.

Kosar, Douglas R., et al., "Dehumidification Issues of Standard 62-1989", ASHARE Journal, (Mar. 1998), 71-75.

Larson, Michael David, et al., "The Performance of Membranes in a Newly Proposed Run-Around Heat and Mositure Exchanger", Thesis Submitted to the College of Graduate Studies and Research in Partial Fulfillment of the Requirements For the Degree of Master of Science in the Department of Mechanical Engineering University of Saskatchewan Saskatoon Canada, http/ /lib ran. usask.ca/theses/ available/etd-12192006-094159/umestricted/Larson Thesis.pdf, (Dec. 2006), 177 pgs.

LePoudre, P., et al., "Channel Flow with Sinusoidal Screen Insert", Dept. of Mech Engineering, Univ. of Saskatchewan, Proceedings of the 19th Annual Conference of the CFD Society of Canada, Montreal, Apr. 28-29, 2011, (2011), 6 pgs.

Mahmud, Khizir, "Design and Performance Testing of Counter-Cross-Flow Run-Around Membrane Energy Exchanger System", Master Thesis Submitted to the College of Graduate Studies and Research in Partial Fulfillment of the Requirements For the Degree of Master of Science in the Department of Mechanical Engineering University of Saskatchewan Saskatoon Canada, http l /libran.usask.ca/theses/ available/ etd-09092009-223 833/umestricted/Khizir_Mahmud 2009-Sep-28a. pdf, (Sep. 2009), 176 pgs.

Mahmud, Khizir, et al., "Performance testing of a counter-cross-flow run-around membrane energy exchanger (RAMEE) system for HVAC applications", Energy and Buildings, 42, (2010), 1140-1146.

McGahey, Kevin, et al., "Desiccants: Benefits for the Second Century of Air Conditioning", Proceedings of the Tenth Symposium On Improving Building Systems in Hot and Humid Climates, Ft. Worth, Texas, (May 14, 1996), 9 pgs.

McGahey, Kevin, "New Commercial Applications For Desiccant-Based Cooling", ASHARE Journal, (Jul. 1998), 41-45.

Mumma, Stanley A., et al., "Achieving Dry Outside Air in an Energy-Efficient Manner", ASHRAE Transactions 2001; vol. 107; Part 1, (2001), 8 pgs.

Mumma, Stanley A., "Dedicated Outdoor Air-Dual Wheel System Control Requirements", ASHRAE Transactions 2001; vol. 107; Part 1, (2001), 9 pgs.

Mumma, Stanley A., et al., "Extension of the Multiple Spaces Concept of ASH RAE Standard 62 to Include Infiltration, Exhaust/Exfiltration, Interzonal Transfer, and Additional Short-Circuit Paths", ASHRAE Transactions: Symposia, (1998), 1232-1241.

Mumma, Stanley A, "Overview of Integrating Dedicated Outdoor Air Systems With Parallel Terminal Systems", ASH RAE Transactions vol. 107; Part 1, (2001), 7 pgs.

Nimmo, B. G., et al., "DEAC: Desiccant Enhancement of Cooling-Based Dehumidification", ASHRAE Transactions: Symposia, (1993), 842-848.

Qin, C. K., et al., "Engine-driven Desiccant-assisted Hybrid Air-conditioning System", 23rd World Gas Conference, Amsterdam, (2006), 15 pgs.

Ryan, K., et al., "Three-dimensional transition in the wake of bluff elongated cylinders", J. Fluid Mech., vol. 538, (2005), 1-29.

Scofield, C. Mike, et al., "HVAC Design Design for Classrooms: Divide and Conquer", Heating/Piping/Air Conditioning, (May 1993), 53-59.

Sevigny, Scott P., et al., "Air Handling Unit Direct Digital Control System Retrofit To Provide Acceptable Indoor Air Quality and Global Energy Optimization", Energy Engineering; vol. 94; No. 5, (1997), 24-43.

Shank, Kurt M., et al., "Selecting the Supply Air Conditions for a Dedicated Outdoor Air System Working in Parallel with Distributed Sensible Cooling Terminal Equipment", ASHRAE Transactions vol. 107; Part 1, (2001), 10 pgs.

Smith, Christopher S., et al., "Outdoor Air, Heat Wheels and JC Penny: A New Approach to Retail Ventilation", Proceedings of the Eleventh Symposium On Improving Building Systems in Hot and Humid Climates, Ft. Worth, Texas, (Jun. 2, 1998), 1 pg.

Smith, James C., "Schools Resolve IAQ/Humidity Problems with Desiccant Preconditioning", Heating/Piping/Air Conditioning, (Apr. 1996), 6 pgs.

Sorin, Ain A., et al., "Optimization of Flow Design in Forced Flow Electrochemical Systems, with Special Application to Electrodialysis", Ind. Eng. Chem, Process Des. Develop vol. 13, No. 3, (1974), 241-248.

(56) References Cited

OTHER PUBLICATIONS

Swails, James F., et al., "A Cure for Growing Pains", Consulting Specifying Engineer, [Online] retrieved from the internet:www.csermag.com, (Jun. 1997), 4 pgs.
Turpin, Joanna, "Dehumidification: The Problem No One Wants To Talk About (Apr. 2000)", [online] [retrieved on May 6, 2011]. Retrieved from the Internet: http//www.esmagazine.com/copyrighVde12c1c879ba801 0VgnVCM1 00000f932a8c0_?>, (posted on Apr. 5, 2000), 6 pgs.
Vali, Alireza, et al., "Numerical model and effectiveness correlations for a run-around heat recovery system with combined counter and cross flow exchangers", International Journal of Heat and Mass Transfer 52, (2009), 5827-5840 pgs.
Vali, Alireza, "Modeling a Run-Around Heat and Moisture Exchanger Using Two Counter/Cross Flow Exchangers", Master Thesis Submitted to the College of Graduate Studies and Research in Partial Fulfillment of the Requirements For the Degree of Master of Science in the Department of Mechanical Engineering University of Saskatchewan Saskatoon Canada, http:/ /library. usask.ca/theses/m ailable/etd-060 3 2009-15-J.6-J.-1./unrestricted/ Vali.Alireza Thesis. pdf, (2009), 193 pgs.
Yborra, Stephen C., "Field Evaluation of Desiccant-Integrated HVAC Systems: A Review of Case Studies in Multiple Commercial/Institutional Building Types", Proceedings of the Eleventh Symposium On Improving Building Systems in Hot and Humid Climates, Ft. Worth, Texas, (Jun. 2, 1998), 361-370.
"U.S. Appl. No. 13/449,598, Notice of Allowance dated Jul. 6, 2017", 7 pgs.
"U.S. Appl. No. 13/797,152, Notice of Allowance dated Jun. 27, 2017", 8 pgs.
"U.S. Appl. No. 14/171,951, Notice of Allowance dated Jun. 8, 2017", 5 pgs.
"U.S. Appl. No. 14/171,951, Notice of Allowance dated Oct. 3, 2017", 5 pgs.
"U.S. Appl. No. 14/190,715, Non Final Office Action dated Aug. 10, 2017", 9 pgs.
"U.S. Appl. No. 14/190,715, Response filed Jul. 12, 2017 to Restriction Requirement dated Apr. 12, 2017", 7 pgs.
"U.S. Appl. No. 14/190,715, Response filed Nov. 9, 2017 to Non Final Office Action dated Aug. 10, 2017", 10 pgs.
"U.S. Appl. No. 14/192,019, Response filed Aug. 21, 2017 to Non Final Office Action dated May 19, 2017", 13 pgs.
"U.S. Appl. No. 14/804,953, Notice of Allowance dated Sep. 7, 2017", 7 pgs.
"U.S. Appl. No. 14/957,795, Final Office Action dated Nov. 6, 2017", 17 pgs.
"U.S. Appl. No. 14/957,795, Response filed Aug. 3, 2017 to Non Final Office Action dated Apr. 3, 2017", 17 pgs.
"U.S. Appl. No. 15/590,685, Non Final Office Action dated Oct. 6, 2017", 11 pgs.
"Australian Application Serial No. 2013305427, Response filed Oct. 10, 2017 to Examination Report dated Mar. 3, 2017", 30 pgs.
"Australian Application Serial No. 2013305428, Office Action dated May 30, 2017", 5 pgs.
"Australian Application Serial No. 2014231672, First Examiners Report dated Jul. 14, 2017", 4 pgs.
"Australian Application Serial No. 2014231672, Response filed Oct. 9, 2017 to First Examiners Report dated Jul. 14, 2017", 24 pgs.
"Australian Application Serial No. 2014231680, First Examiners Report dated Aug. 4, 2017", 4 pgs.
"Australian Application Serial No. 2014231681, First Examiners Report dated Jul. 12, 2017", 4 pgs.
"Australian Application Serial No. 2014231681, Response filed Sep. 15, 2017 to First Examiners Report dated Jul. 12, 2017", 9 pgs.
"Australian Application Serial No. 2014231681, Subsequent Examiners Report dated Sep. 26, 2017", 4 pgs.
"Canadian Application Serial No. 2,901,483, Office Action dated Jul. 19, 2017", 3 pgs.
"Canadian Application Serial No. 2,901,483, Response filed May 23, 2017 to Office Action dated Nov. 23, 2016", 40 pgs.
"Chinese Application Serial No. 201380042926.0, Response filed Sep. 26, 2017 to Office Action dated May 11, 2017", claims not amended in response, current pending claims included in attachment, 13 pgs.
"Chinese Application Serial No. 201380044484.3, Office Action dated Jul. 31, 2017", With English Translation, 21 pgs.
"Chinese Application Serial No. 201380044484.3, Response filed Oct. 12, 2017 to Office Action dated Jul. 31, 2017", w/ claims in English, 54 pgs.
"Chinese Application Serial No. 201480014783.7, Office Action dated Jun. 30, 2017", (English Translation), 19 pgs.
"Chinese Application Serial No. 201480015355.6, Office Action dated Oct. 13, 2017", w/English translation, 13 pgs.
"Chinese Application Serial No. 201480015355.6, Response filed Jun. 13, 2017 to Office Action dated Nov. 28, 2016", (w/English Translation of Claims), 36 pgs.
"Chinese Application Serial No. 201480015422.4, Response filed May 12, 2017 to Office Action dated Nov. 1, 2016", w/ claims in English, 47 pgs.
"Chinese Application Serial No. 201480016150.X, Office Action dated Jun. 19, 2017", (w/ English Translation), 22 pgs.
"Chinese Application Serial No. 201480016150.X, Response filed Nov. 2, 2017 to Office Action dated Jun. 19, 2017", w/ claims in English, 82 pgs.
"European Application Serial No. 14764305.0, Response filed Oct. 31, 2017 to Extended European Search Report dated Apr. 4, 2017", 7 pgs.
"European Application Serial No. 14764318.3, Response filed Oct. 10, 2017 to Extended European Search Report dated Mar. 15, 2017", 11 pgs.
"European Application Serial No. 14764713.5, Response filed Jul. 13, 2017 to Extended European Search Report dated Dec. 9, 2016", 9 pgs.
"European Application Serial No. 15834201.4, Response filed Oct. 9, 2017 to Communication Pursuant to Rules 161(2) and 162 EPC dated Mar. 29, 2017", 15 pgs.
"U.S. Appl. No. 13/797,062, Amendment and Response Under 37 C.F.R. 1.116 Filed Jan. 22, 2018 to Final Office Action dated Feb. 24, 2016", 11 pgs.
"U.S. Appl. No. 13/797,062, Non Final Office Action dated Feb. 21, 2018", 21 pgs.
"U.S. Appl. No. 13/797,062, Response filed May 21, 2018 to Non Final Office Action dated Feb. 21, 2018", 12 pgs.
"U.S. Appl. No. 14/171,951, Notice of Allowance dated Jan. 19, 2018", 5 pgs.
"U.S. Appl. No. 14/171,951, Notice of Allowance dated May 23, 2018", 5 pgs.
"U.S. Appl. No. 14/190,715, Final Office Action dated Feb. 20, 2018", 9 pgs.
"U.S. Appl. No. 14/192,019, Non Final Office Action dated May 11, 2018", 16 pgs.
"U.S. Appl. No. 14/192,019, Response filed Apr. 27, 2018 to Final Office Action dated Nov. 28, 2017", 11 pgs.
"U.S. Appl. No. 14/804,953, Corrected Notice of Allowance dated Jan. 25, 2018", 4 pgs.
"U.S. Appl. No. 14/830,492, Non-Final Action dated Mar. 15, 2018", 9 pgs.
"U.S. Appl. No. 14/830,492, Response filed Feb. 15, 2018 to Restriction Requirement dated Dec. 15, 2017", 7 pgs.
"U.S. Appl. No. 14/830,492, Restriction Requirement dated Dec. 15, 2017", 6 pgs.
"U.S. Appl. No. 14/957,795, Corrected Notice of Allowance dated May 16, 2018", 4 pgs.
"U.S. Appl. No. 14/957,795, Notice of Allowance dated Apr. 27, 2018", 8 pgs.
"U.S. Appl. No. 14/957,795, Response filed Apr. 3, 2018 to Final Office Action dated Nov. 6, 2017", 11 pgs.
"U.S. Appl. No. 15/185,155, Non Final Office Action dated Apr. 10, 2018", 13 pgs.
"U.S. Appl. No. 15/590,685, Final Office Action dated Jun. 7, 2018", 12 pgs.
"U.S. Appl. No. 15/590,685, Response filed Feb. 20, 2018 to Non Final Office Action dated Oct. 6, 2017", 7 pgs.

(56) References Cited

OTHER PUBLICATIONS

"Australian Application Serial No. 2013305428, Response filed May 15, 2018 to Office Action dated May 30, 2017", 23 pgs.
"Australian Application Serial No. 2014231667, First Examination Report dated Apr. 5, 2018", 4 pgs.
"Australian Application Serial No. 2014231668, First Examination Report dated Dec. 6, 2017", 6 pgs.
"Australian Application Serial No. 2014231668, Response filed Mar. 14, 2018 to First Examination Report dated Dec. 6, 2017", 31 pgs.
"Australian Application Serial No. 2014231668, Subsequent Examiners Report dated Apr. 5, 2018", 3 pgs.
"Australian Application Serial No. 2014231681, Response filed Jan. 30, 2018 to Subsequent Examiners Report dated Sep. 26, 2017", 15 pgs.
"Australian Application Serial No. 2014231681, Response filed Apr. 26, 2018 to Subsequent Examiners Report dated Mar. 13, 2018", 3 pgs.
"Australian Application Serial No. 2014231681, Subsequent Examiners Report dated Mar. 13, 2018", 4 pgs.
"Australian Application Serial No. 2015230799, Response filed Feb. 16, 2018 to First Examiner Report dated Mar. 27, 2017", 24 pgs.
"Canadian Application Serial No. 2,801,352, Office Action dated Jul. 4, 2017", 3 pgs.
"Canadian Application Serial No. 2,801,352, Response filed Dec. 18, 2017 to Office Action dated Jul. 4, 2017", 8 pgs.
"Canadian Application Serial No. 2,901,483, Response filed Jan. 16, 2018 to Office Action dated Jul. 19, 2017", 28 pgs.
"Chinese Application Serial No. 201380042926.0, Decision of Rejection dated Jan. 5, 2018", w. English Claims, 11 pgs.
"Chinese Application Serial No. 201380042926.0, Request for Reexamination filed Apr. 20, 2018 to Decision of Rejection dated Jan. 5, 2018", w/ English claims, 52 pgs.
"Chinese Application Serial No. 201380044484.3, Examiner Interview Summary dated Jan. 3, 2018", English Translation, 1 pg.
"Chinese Application Serial No. 201380044484.3, Response filed Jan. 3, 2018 to Examiner Interview Summary dated Jan. 3, 2018", w/ English claims, 53 pgs.
"Chinese Application Serial No. 201480014783.7, Office Action dated Mar. 26, 2018", W/English Translation, 16 pgs.
"Chinese Application Serial No. 201480014783.7, Response filed Nov. 10, 2017 to Office Action dated Jun. 30, 2017", w/ claims in English, 48 pgs.
"Chinese Application Serial No. 201480015355.6, Response filed Feb. 28, 2018 to Office Action dated Oct. 13, 2017", w/claims in English, 36 pgs.
"European Application Serial No. 15834201.4, Extended European Search Report dated Mar. 16, 2018", 8 pgs.
"European Application Serial No. 18153408.2, Communication Pursuant to Rule 55 EPC dated May 17, 2018", 2 pgs.
"International Application Serial No. PCT/CA2016/050252, International Preliminary Report on Patentability dated Nov. 30, 2017", 6 pgs.
"International Application Serial No. PCT/CA2016/050507, International Preliminary Report on Patentability dated Nov. 30, 2017", 5 pgs.
"International Application Serial No. PCT/IB2016/053799, International Preliminary Report on Patentability dated Jan. 4, 2018", 8 pgs.
U.S. Appl. No. 15/574,201, filed Nov. 15, 2017, Using Liquid to Air Membrane Energy Exchanger for Liquid Cooling.
U.S. Appl. No. 60/163,731, filed Nov. 5, 1999, Humidity Pump.
U.S. Appl. No. 15/574,205, filed Nov. 15, 2017, Systems and Methods for Managing Conditions in Enclosed Space.
U.S. Appl. No. 15/814,153, filed Nov. 15, 2017, Systems and Methods for Providing Cooling to a Heat Load.
"U.S. Appl. No. 14/190,715, Response filed Jul. 20, 2018 to Final Office Action dated Feb. 20, 2018", 14 pgs.
"U.S. Appl. No. 13/797,062, Final Office Action dated Jul. 13, 2018", 22 pgs.
"U.S. Appl. No. 13/797,062, Response filed Dec. 13, 2018 to Final Office Action dated Jul. 13, 2018", 12 pgs.
"U.S. Appl. No. 14/171,951, Notice of Allowability dated Jul. 18, 2018", 2 pgs.
"U.S. Appl. No. 14/190,715, Advisory Action dated Aug. 16, 2018", 6 pgs.
"U.S. Appl. No. 14/190,715, Examiner Interview Summary dated Oct. 31, 2018", 3 pgs.
"U.S. Appl. No. 14/192,019, Response filed Sep. 11, 2018 to Non Final Office Action dated May 11, 2018", 12 pgs.
"U.S. Appl. No. 14/830,492, Response filed Aug. 15, 2018 to Non Final Office Action dated Mar. 15, 2018", 12 pgs.
"U.S. Appl. No. 14/957,795, Notice of Allowance dated Sep. 11, 2018", 9 pgs.
"U.S. Appl. No. 15/185,155, Final Office Action dated Dec. 5, 2018", 11 pgs.
"U.S. Appl. No. 15/185,155, Response filed Aug. 6, 2018 to Non Final Office Action dated Apr. 10, 2018", 10 pgs.
"U.S. Appl. No. 15/185,180, Response filed Nov. 19, 2018 to Restriction Requirement dated Jun. 21, 2018", 9 pgs.
"U.S. Appl. No. 15/185,180, Restriction Requirement dated Jun. 21, 2018", 10 pgs.
"U.S. Appl. No. 15/574,201, Restriction Requirement dated Sep. 5, 2018", 6 pgs.
"U.S. Appl. No. 15/574,205, Non Final Office Action dated Sep. 11, 2018", 6 pgs.
"U.S. Appl. No. 15/590,685, Advisory Action dated Dec. 12, 2018", 3 pgs.
"U.S. Appl. No. 15/590,685, Response filed Nov. 30, 2018 to Final Office Action dated Jun. 7, 2018", 10 pgs.
"U.S. Appl. No. 15/739,016, Restriction Requirement dated Nov. 26, 2018", 5 pgs.
"Australian Application Serial No. 2014231667, Response filed Jul. 20, 2018 to First Examination Report dated Apr. 5, 2018", 19 pgs.
"Australian Application Serial No. 2014231667, Subsequent Examiners Report dated Aug. 29, 2018", 4 pgs.
"Australian Application Serial No. 2017204552, First Examination Report dated Oct. 9, 2018", 3 pgs.
"Canadian Application Serial No. 2,801,352, Office Action dated Aug. 2, 2018", 3 pgs.
"Chinese Application Serial No. 201380042926.0, Notice of Reexamination dated Aug. 23, 2018", w/ English Machine Translation, 18 pgs.
"Chinese Application Serial No. 201380042926.0, Response filed Dec. 7, 2018 to Notice of Reexamination dated Aug. 23, 2018", w/ English Translation, 15 pgs.
"Chinese Application Serial No. 201480014783.7, Response filed Jun. 11, 2018 to Office Action dated Mar. 26, 2018", w/ English claims, 18 pgs.
"Chinese Application Serial No. 201480015355.6, Office Action dated Jun. 14, 2018", w/English summary, 8 pgs.
"Chinese Application Serial No. 201480015355.6, Response filed Dec. 4, 2018 to Office Action dated Jun. 14, 2018", w/ English claims, 16 pgs.
"European Application Serial No. 11797695.1, Communication Pursuant to Article 94(3) EPC dated Aug. 24, 2018", 5 pgs.
"European Application Serial No. 14764713.5, Communication pursuant to Article 94(3) EPC dated Dec. 18, 2018", 3 pgs.
"European Application Serial No. 14765396.8, Communication Pursuant to Article 94(3) EPC dated Dec. 5, 2018", 4 pgs.
"European Application Serial No. 15834201.4, Response filed Oct. 15, 2018 to Extended European Search Report dated Mar. 16, 2018", 17 pgs.
"European Application Serial No. 16795581.4, Response filed Aug. 6, 2018 to Communication Pursuant to Rules 161(2) and 162 EPC dated Jan. 26, 2018", 16 pgs.
"European Application Serial No. 16795582.2, Extended European Search Report dated Nov. 20, 2018", 8 pgs.
"European Application Serial No. 16795582.2, Response filed Jul. 17, 2018 to Communication Pursuant to Rules 161(2) and 162 EPC dated Jan. 8, 2018", 12 pgs.

(56) References Cited

OTHER PUBLICATIONS

"European Application Serial No. 18153408.2, Extended European Search Report dated Dec. 4, 2018", 5 pgs.

"International Application Serial No. PCT/CA2017/050180, International Preliminary Report on Patentability dated Sep. 20, 2018", 6 pgs.

"U.S. Appl. No. 13/797,062, Appeal Decision mailed Nov. 22, 2017", 15 pgs.

"U.S. Appl. No. 14/192,019, Final Office Action dated Nov. 28, 2017", 16 pgs.

* cited by examiner

EVAPORATIVE COOLING SYSTEM WITH LIQUID-TO-AIR MEMBRANE ENERGY EXCHANGER

CROSS-REFERENCE TO RELATED APPLICATIONS

This application claims priority to U.S. Provisional Application No. 61/799,321, filed 15 Mar. 2013, entitled "Evaporative Cooling Using A Membrane Energy Exchanger," which is hereby incorporated by reference in its entirety.

BACKGROUND

Embodiments of the present disclosure generally relate to evaporative cooling systems and methods, and more particularly to evaporative cooling systems and methods that may utilize a liquid-to-air membrane energy exchanger (LAMEE).

Evaporative coolers cool a supply air stream that is supplied to a space through the evaporation of a cooling fluid, such as water. As the fluid evaporates, heat from an air stream (e.g., the supply air stream in a direct evaporative cooler) in contact with the fluid is transferred to the fluid according to the enthalpy of vaporization of the fluid. Evaporative cooling differs from conventional vapor-compression or absorption refrigeration air conditioning systems, which typically require more energy to achieve the same cooling effect as evaporative coolers in conditions suitable for evaporative coolers. For example, evaporative coolers may only require a water supply to provide the evaporative fluid and optionally an air stream modulator, such as a fan, to usher the air stream into contact with the fluid, which results in a large energy savings over compressor-type air conditioners. However, conventional evaporative coolers have limited ranges of suitable conditions and, even in suitable conditions, have limited achievable cooling ranges.

For example, the temperature of the air coming out of the evaporative cooler may not be easily controlled and is dependent on the outdoor air temperature and humidity level. The cooling potential of the system is limited in part by the outdoor wet bulb temperature, which factors in both the outdoor air temperature and humidity. As the humidity of the outdoor air increases, the cooling power or potential of the evaporative cooling system decreases and the supply air may be excessively humid. In humid climates, conventional evaporative coolers may not be able to cool the supply air to a comfortable temperature and humidity. As a result, more energy intensive air conditioning alternatives, such as vapor-compression air conditioners, are often used.

Direct evaporative coolers utilize direct contact between evaporating liquid water and a supply air stream to cool the supply air stream. Conventional direct evaporative coolers, although typically more energy efficient than vapor compression systems, have several drawbacks. The supply air temperature coming out of the cooler may not be easily controlled and is dependent on the outdoor air temperature and humidity level. As a result, the supply air may be excessively humid. Direct evaporative cooling systems need careful maintenance to ensure that bacteria, algae, fungi, and other contaminants do not proliferate in the water system and transfer into the supply air stream. Since these systems utilize direct contact between the evaporating liquid water and supply air, carryover of contaminants into the air stream may occur, leading to reduced indoor air quality, odors, and "sick building syndrome." Buildup of mineral deposits in the unit and on evaporative pads may reduce performance and require maintenance to remedy.

Evaporative cooling towers work by the same principle and suffer from some of the same challenges as direct evaporative coolers. The accumulation of dissolved minerals in the circulating cooling water may lead to deposits and scaling on the exchange surfaces which reduces performance. Corrosion of metal components and piping in cooling towers is a common concern. Draw-off or purging is principally used to control mineral concentration levels in the water circuit. Biocides, algaecides, filtration, and other treatment methods are used to control the growth of microorganisms and biofilm. Micro-organisms such as bacteria, algae, and fungi may grow rapidly in the warm water. Of particular concern is the growth of Legionella which may cause Legionnaires' disease. For example, cooling towers with open evaporative water systems may spread Legionella via mist droplets leaving the cooling tower and drifting into the surrounding environment. A number of serious outbreaks of Legionnaires' disease leading to fatalities are attributable to cooling towers by this phenomenon. As a result, stringent guidelines for treatment and maintenance of cooling tower water systems have been developed. The high levels of required maintenance, including the cost and complexity of maintaining proper levels of all treatment chemicals, is a significant drawback for open circuit cooling towers used in heating, ventilation, and air conditioning (HVAC) and industrial cooling applications.

A need remains for an evaporative cooling system that can be used in a wider range of conditions and applications to achieve cooling temperatures that are lower than achievable temperatures in conventional evaporative coolers. Further, a need remains for an evaporative cooling system that avoids the need to use energy-intensive compressor-type air conditioners.

SUMMARY

Certain embodiments of the present disclosure provide an evaporative cooling system that may include an evaporative cooler liquid-to-air membrane energy exchanger (LAMEE), a first liquid-to-air heat exchanger (LAHE), and a cooling fluid circuit. The evaporative cooler LAMEE may be disposed within a scavenger air plenum that is configured to channel a scavenger air stream. The first LAHE may be disposed within a process air plenum that is configured to channel a process air stream. The cooling fluid circuit may be configured to circulate an evaporative cooling fluid between the evaporative cooler LAMEE and the first LAHE. The evaporative cooler LAMEE may be configured to utilize the scavenger air stream to evaporatively cool the cooling fluid. The first LAHE may be configured to receive the cooling fluid from the evaporative cooler LAMEE and to allow the cooling fluid to absorb heat from the process air stream to cool the process air stream.

Optionally, the evaporative cooling system may further include a second LAHE disposed within the scavenger air plenum upstream of the evaporative cooler LAMEE in a direction of flow of the scavenger air stream. The second LAHE may be configured to receive the cooling fluid from at least one of the evaporative cooler LAMEE or the first LAHE and to allow heat transfer between the cooling fluid and the scavenger air stream upstream of the evaporative cooler LAMEE. Optionally, the evaporative cooling system may further include an air-to-air heat exchanger (AAHE) disposed along the scavenger air plenum downstream of the evaporative cooler LAMEE in the direction of flow of the scavenger air stream and within the process air plenum upstream of the first LAHE in a direction of flow of the process air stream. The AAHE is configured to receive both the scavenger air stream and the process air stream and to allow the scavenger air stream to absorb heat from the process air stream prior to the process air stream entering the first LAHE.

Certain embodiments of the present disclosure provide an evaporative cooling system that may include an evaporative cooler liquid-to-air membrane energy exchanger (LAMEE), a cooling fluid circuit, and an air-to-air heat exchanger (AAHE). The evaporative cooler LAMEE may be disposed within a scavenger air plenum that is configured to channel a scavenger air stream. The evaporative cooler LAMEE may be configured to receive a scavenger air supply stream through an air inlet and to discharge a scavenger air exhaust stream through an air outlet. The evaporative cooler LAMEE may be further configured to receive an evaporative cooling fluid through a fluid inlet and to evaporatively cool the cooling fluid by allowing the cooling fluid to evaporate into the scavenger air stream. The cooling fluid circuit may be configured to circulate the cooling fluid between the evaporative cooling LAMEE and a first liquid-to-air heat exchanger (LAHE). The first LAHE may be disposed within a process air plenum that is configured to channel a process air stream. The first LAHE may be configured to receive the cooling fluid from the evaporative cooler LAMEE and to allow the cooling fluid to absorb heat from the process air stream to cool the process air stream. The air-to-air heat exchanger (AAHE) may be disposed along the scavenger air plenum downstream of the evaporative cooler LAMEE in a direction of flow of the scavenger air stream. The AAHE may be configured to receive the scavenger air exhaust stream and to allow the scavenger air exhaust stream to absorb heat from at least one of the process air stream upstream of the first LAHE in a direction of flow of the process air stream or the scavenger air supply stream upstream of the evaporative cooler LAMEE to cool the process air stream or the scavenger air supply stream, respectively.

Certain embodiments of the present disclosure provide an evaporative cooling method that may include channeling a scavenger air stream through an evaporative cooler liquid-to-air membrane energy exchanger (LAMEE) that is disposed within a scavenger air plenum. The method may include channeling a process air stream through a first liquid-to-air heat exchanger (LAHE) that is disposed within a process air plenum. The method may also include circulating an evaporative cooling fluid between the evaporative cooler LAMEE and the first LAHE through a cooling fluid circuit. The method may further include evaporatively cooling the cooling fluid within the evaporative cooler LAMEE utilizing the scavenger air stream. The method may also include receiving the cooling fluid at the first LAHE from the evaporative cooler LAMEE. The receiving operation may include allowing the cooling fluid to absorb heat from the process air stream to cool the process air stream

DETAILED DESCRIPTION

The foregoing summary, as well as the following detailed description of certain embodiments will be better understood when read in conjunction with the appended drawings. As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Figure 1:
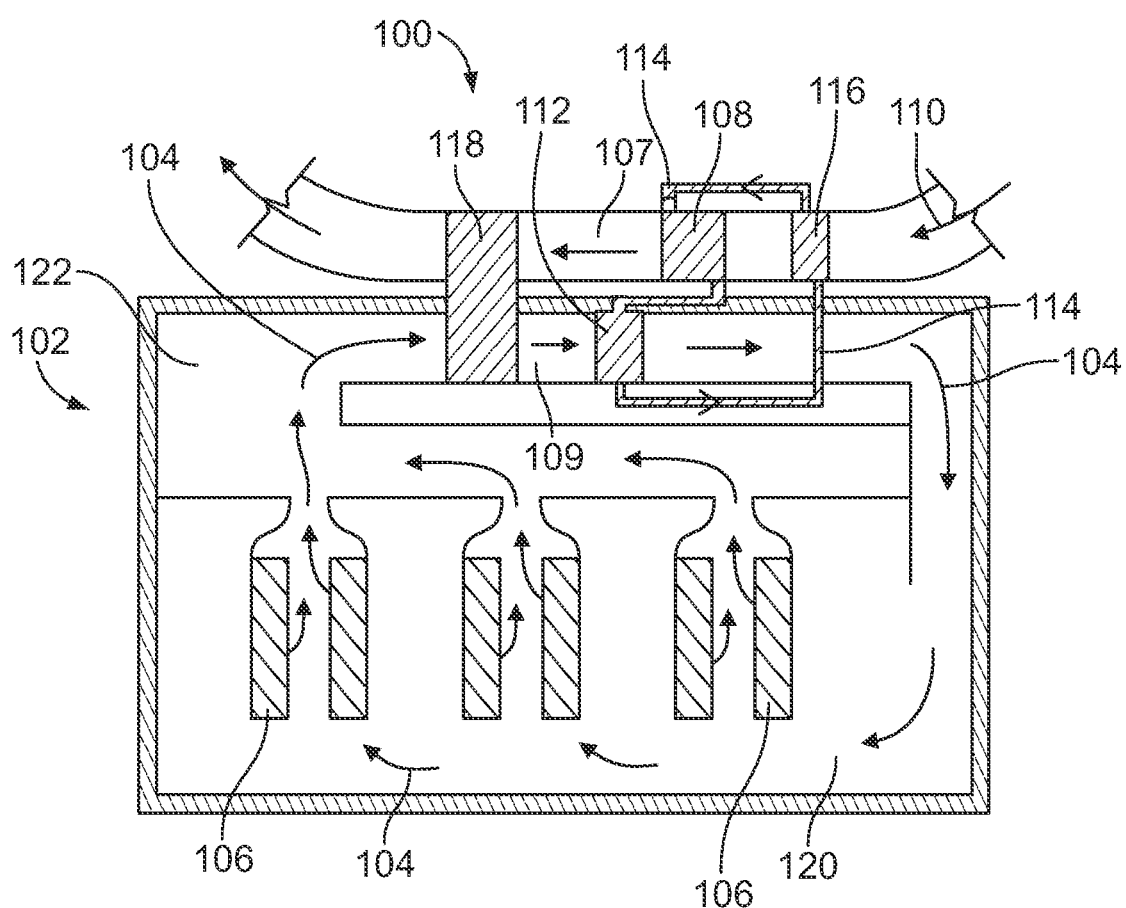
FIG. 1 illustrates an evaporative cooling system in accordance with an embodiment.

FIG. 1 illustrates an evaporative cooling system 100 in accordance with an embodiment. As shown in FIG. 1, the evaporative cooling system 100 may be associated with a data center 102 and is used to cool a process air stream 104 which circulates within the data center 102. The data center 102 includes multiple server racks 106 which generate heat. The process air stream 104 absorbs the heat, which increases the temperature of the process air stream 104. For example, the process air stream 104 may be at least 100° F. upon entering a plenum of the evaporative cooling system 100. In an embodiment, the evaporative cooling system 100 may cool the process air stream 104 to a temperature of less than 80° F., such that the process air stream 104 may be recirculated through the data center 102 to absorb more heat from the server racks 106. Although a data center 102 is shown in FIG. 1, it is noted that FIG. 1 is merely an example application of the evaporative cooling system 100. In other embodiments, the evaporative cooling system 100 may be used in other commercial applications or even residential applications, such as with commercial or residential buildings, and the like.

The evaporative cooling system 100 may include a liquid-to-air membrane energy exchanger (LAMEE) 108 that is used to evaporatively cool a scavenger air stream 110. The LAMEE 108 may be referred to herein as an evaporative cooler 108 and/or an evaporative cooler LAMEE 108. The scavenger air stream 110, also referred to herein as scavenger air 110, may be outdoor air at ambient outdoor conditions. The system 100 also includes a first liquid-to-air heat exchanger (LAHE) 112 (hereafter referred to as cooling coil 112) which is designed to cool the process air stream 104. An evaporative cooling fluid 114 may flow through the LAMEE 108 to evaporatively cool the scavenger air stream 110. The cooling fluid 114 exiting the LAMEE 108, which has been cooled within the LAMEE 108, is circulated to the cooling coil 112. The cooling fluid 114 within the cooling coil 112 absorbs heat from the process air stream 104, which cools the process air stream 104. The evaporative cooling system 100 may be an indirect evaporative cooling system because the air stream that is evaporatively cooled (e.g., the scavenger air stream 110) may be separate from the air that is supplied to the space (e.g., the process air stream 104).

In the illustrated embodiment, the cooling fluid 114 that exits the cooling coil 112 is further circulated to a pre-cooling second LAHE 116 (hereafter referred to as pre-conditioner or pre-conditioner 116). The pre-conditioner 116 is designed to provide pre-cooling (or pre-heating, depending on the air conditions) to the scavenger air stream 110 upstream of the evaporative cooler LAMEE 108 through sensible heat transfer. For example, in hot climates, scavenger air 110 may be pre-cooled by the cooling fluid 114 in the pre-conditioner 116 prior to entering the evaporative cooler LAMEE 108. Pre-cooling the scavenger air 110 lowers the wet bulb temperature of the scavenger air 110, which allows for greater heat transfer between the cooling fluid 114 and the scavenger air 110. However, in moderate climates, the scavenger air 110 may be selectively pre-heated by the cooling fluid 114 in the pre-conditioner 116 prior to entering the evaporative cooler LAMEE 108. Pre-heating the scavenger air 110 increases the moisture transfer potential in the LAMEE 108 (for example, by decreasing the relative humidity of the scavenger air 110), which allows for greater energy transfer between the cooling fluid 114 and the scavenger air 110 in the evaporative cooler LAMEE 108. Due to pre-heating the scavenger air 110, the temperature of the cooling fluid 114 may decrease through the pre-conditioner 116 prior to the cooling fluid 114 entering the evaporative cooler LAMEE 108.

The evaporation process reduces the temperature of the cooling fluid 114 exiting the LAMEE 108 and entering the cooling coil 112. As a result, the cooling fluid 114 absorbs more energy or heat from the process air stream 104, which cools the process air stream 104 to a lower temperature than would be achievable without pre-cooling the scavenger air 110. After exiting the pre-conditioner 116, the cooling fluid 114 may return to the LAMEE 108 to be evaporatively cooled once again. Thus, the cooling fluid 114 may operate in a cooling fluid circuit between the LAMEE 108, the cooling coil 112, and the pre-conditioner 116. Optionally, the cooling fluid circuit may be a closed-loop circuit.

The evaporative cooling system 100 may also include an air-to-air heat exchanger (AAHE) 118. The AAHE 118 may be a heat pipe, a heat wheel, a plate exchanger, or the like. The scavenger air 110 enters the AAHE 118 downstream of the pre-conditioner 116 and LAMEE 108. The scavenger air 110 has been pre-cooled and evaporatively cooled at the intermediate stage 107 just prior to entering the AAHE 118. The process air stream 104 enters the AAHE 118 upstream of the cooling coil 112 as return air that has a higher temperature than the cooled scavenger air 110 entering the AAHE 118. As a result, within the AAHE 118, the process air stream 104 transfers heat to the scavenger air 110. The process air stream 104 leaves the AAHE 118 as preconditioned process air 104 at intermediate stage 109 upstream of the cooling coil 112. The temperature of the scavenger air 110 increases, but the scavenger air 110 exiting the AAHE 118 is discharged as exhaust air from the system 110. Therefore, the AAHE 118 utilizes the lower temperature of the scavenger air stream 110 exiting the LAMEE 108 to provide additional cooling to the process air stream 104 instead of merely exhausting the scavenger air 110 after exiting the LAMEE 108.

The preconditioned process air stream 104 at intermediate stage 109 is directed to the cooling coil 112 for further cooling. The process air stream 104 may pass over the coils of the cooling coil 112, which have a lower temperature than the process air stream 104 due to the cooled cooling fluid 114 within. Heat from the process air stream 104 may be transferred through the coils to the cooling fluid 114, which reduces the temperature of the process air stream 104. As shown in FIG. 1, the cooled process air stream 104 that exits the cooling coil 112 is supplied back to a cold aisle 120 of the data center 102. Therefore, the evaporative cooling system 100 may include multiple cooling devices and/or operations for cooling the process air stream 104. As shown in FIG. 1, the hot return process air stream 104 is first pre-cooled in the AAHE 118 and then is further cooled in the cooling coil 112. The pre-cooling step allows the process air stream 104 to reach a lower temperature than would be achievable without such pre-cooling.

The cooled process air stream 104 in the cold aisle 120 absorbs heat from the server racks 106 before entering a hot aisle 122 of the data center 102. The hot aisle 122 receives and directs the hot process air stream 104 towards an entry plenum of the evaporative cooling system 100. Thus, the process air stream 104 is recirculated through the data center 102. Optionally, outside air may be mixed with the process air stream 104 and/or some process air stream 104 may be purged. In an alternative embodiment, the cooling fluid 114 exiting the evaporative cooler LAMEE 108 may be conveyed directly to the server racks 106 or other heat sources. For example, the cooling coil 112 or a different heat exchanger may be disposed at or proximate to the server racks 106 to provide liquid cooling instead or, or in addition to, cooling the process air stream 104 that circulates the data center 102.

The evaporative cooling system 100 as described herein is capable of cooling the process air stream 104 to temperatures below the wet bulb temperature of the outdoor air (e.g., the scavenger air 110) without requiring dehumidification of the outdoor air or supplemental cooling (e.g., chillers). The process air stream 104 may be cooled to temperatures that theoretically approach the dew point of the outdoor air. Although dehumidification and/or supplemental cooling are not required, such additional operations and/or components may be added to the system 100 to boost the cooling of the process air stream 104, as described in one or more embodiments herein.

Figure 2:
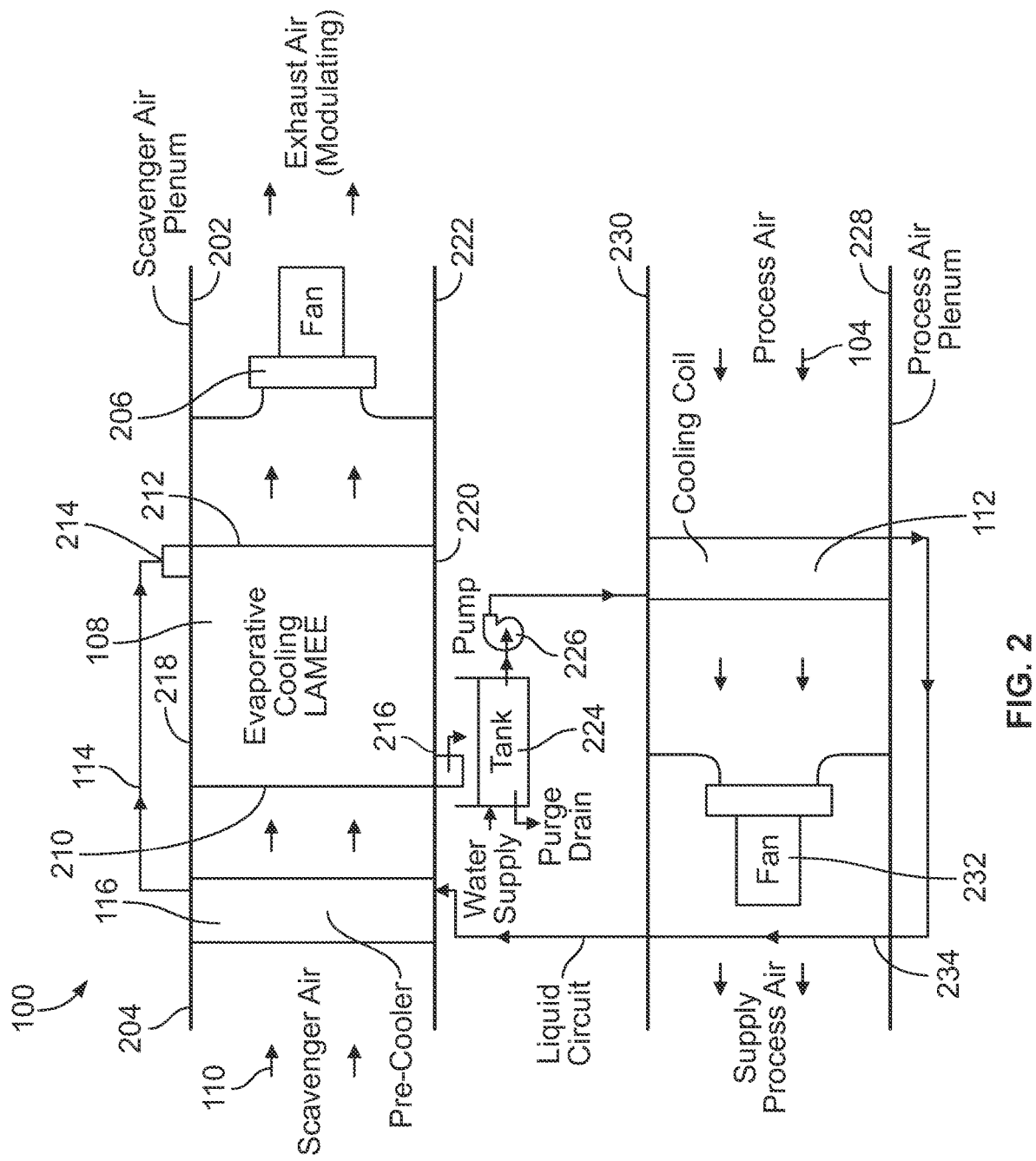
FIG. 2 is a schematic diagram of an embodiment of the evaporative cooling system shown in FIG. 1.

FIG. 2 is a schematic diagram of an embodiment of the evaporative cooling system 100 shown in FIG. 1. The evaporative cooling system 100 shown in FIG. 2 includes components that allow for evaporatively cooled fluid 114 to cool a process air stream 104 and to pre-cool a scavenger air stream 110. In the illustrated embodiment, the evaporative cooling system 100 includes the evaporative cooler LAMEE 108, the cooling coil 112, and the pre-conditioner 116.

The evaporative cooler LAMEE 108 may include an air inlet 210 and an air outlet 212. The scavenger air stream 110 is received through the air inlet 210 and is discharged through the air outlet 212. Optionally the air inlet 210 and/or air outlet 212 may have a cross-sectional area that is the width of a scavenger air plenum 202. The LAMEE 108 also includes a fluid inlet 214 and a fluid outlet 216, which are configured to receive and discharge the cooling fluid 114, respectively. In an embodiment, the fluid inlet 214 may be located at a top 218 of the LAMEE 108 such that the cooling fluid 114 may cascade downwards through the interior of the LAMEE 108 towards the fluid outlet 216 at a base 220 of the LAMEE 108. The LAMEE 108 may also include multiple membrane separation layers (not shown) that have a barrier formed by a semi-permeable membrane (not shown). The membrane barrier may be configured to allow the transfer of heat and vapor (e.g., water vapor) across the membrane but not contaminants, such as solids and liquids. The membrane may be hydrophilic, hydrophobic, porous, or the like. In one embodiment, the membrane may be hydrophilic and non-porous such that the membrane allows water vapor to transfer across but not air or liquid water.

Heat from the scavenger air 110 is transferred to the cooling fluid 114 within the LAMEE 108. For example, the membrane separation layers may be spaced apart to define channels therebetween. In one embodiment, the channel on one side of one membrane barrier may receive the cooling fluid 114 therein, while the adjacent channel on the other side of the membrane barrier may receive the scavenger air stream 110. When the vapor pressure of the cooling fluid 114 is higher than the vapor pressure of the scavenger air stream 110, evaporation occurs in the cooling fluid 114. Heat is collected as evaporation occurs. At least some of the heat may come from the cooling fluid 114, which cools the cooling fluid 114. In addition, some heat may come from the scavenger air stream 110, such that the heat transfers across the membrane barrier into the cooling fluid 114. Evaporated vapor from the cooling fluid 114 may transfer across the membrane barrier from the cooling fluid 114 into the scavenger air stream 110. The transfer of the vapor into the scavenger air stream 110 cools the cooling fluid 114. The scavenger air 110 absorbs the vapor, which cools and increases the humidity of the scavenger air stream 110. As a result of latent heat transfer through evaporation, both the cooling fluid 114 discharged from the fluid outlet 216 and the air stream 110 discharged from the air outlet 212 may be cooler than upon entering the evaporative cooler LAMEE 108.

The evaporative cooler LAMEE 108 may eliminate at least some of the maintenance requirements and concerns of conventional "open" evaporative systems, where the evaporative fluid is in direct contact with the air stream that absorbs the fluid vapor. In an embodiment, the membrane barriers of the LAMEE 108 prohibit the transfer of contaminants and micro-organisms, such as microbes, between the air and the fluid. The membranes protect the cooling fluid 114 from contaminants in the scavenger air stream 110, which greatly reduces build-up of such contaminants and micro-organisms in the cooling fluid. As a result, the frequency of chemical treatments and/or filtering of the cooling fluid 114 may be reduced. In addition, the evaporative cooling system 100 may connect directly to potable water sources and may control mineral build-up by periodic flushing or purging of the cooling fluid.

The cooling fluid 114 circulates the system 100 in a cooling fluid circuit that may be a closed-loop circuit. The cooling fluid 114 may be water, liquid desiccant, glycol, other hygroscopic fluids, other evaporative liquids, and/or combinations thereof. Starting at the fluid inlet 214 of the LAMEE 108, for example, the cooling fluid 114 flows through the LAMEE 108 to the fluid outlet 216, where the temperature of the cooling fluid 114 is reduced. In an embodiment, the temperature of the cooling fluid 114 leaving the LAMEE 108 is lower than the temperature of the cooling fluid 114 at all other locations in the cooling fluid circuit. The cooling fluid 114 may be expelled into a tank 224 or other reservoir for storage of cooling fluid 114. The tank 224 may have a purge drain and a fresh fluid inlet, such as a water supply. Optionally, the purge drain and the fresh fluid inlet may be the only access points to the cooling fluid 114 in the closed-loop cooling fluid circuit. Cooling fluid 114 from within the tank 224 may be pumped from the tank 224 using one or more pumps 226, if necessary, to supply the cooling fluid 114 to the cooling coil 112. The pump(s) 226 may be used to selectively adjust the flow rate of the cooling fluid 114 through the fluid circuit.

In an embodiment, the cooling fluid 114 is a liquid desiccant that is a low concentration salt solution. The presence of salt may sanitize the cooling fluid 114 to prevent microbial growth in the system 100. In addition, the desiccant salt affects the vapor pressure of the solution and allows the cooling fluid to either release or absorb moisture from the air. As such, the concentration of the liquid desiccant may be adjusted for control purposes to control the amount of cooling of the scavenger air stream 110 within the evaporative cooler LAMEE 108.

Figure 3:
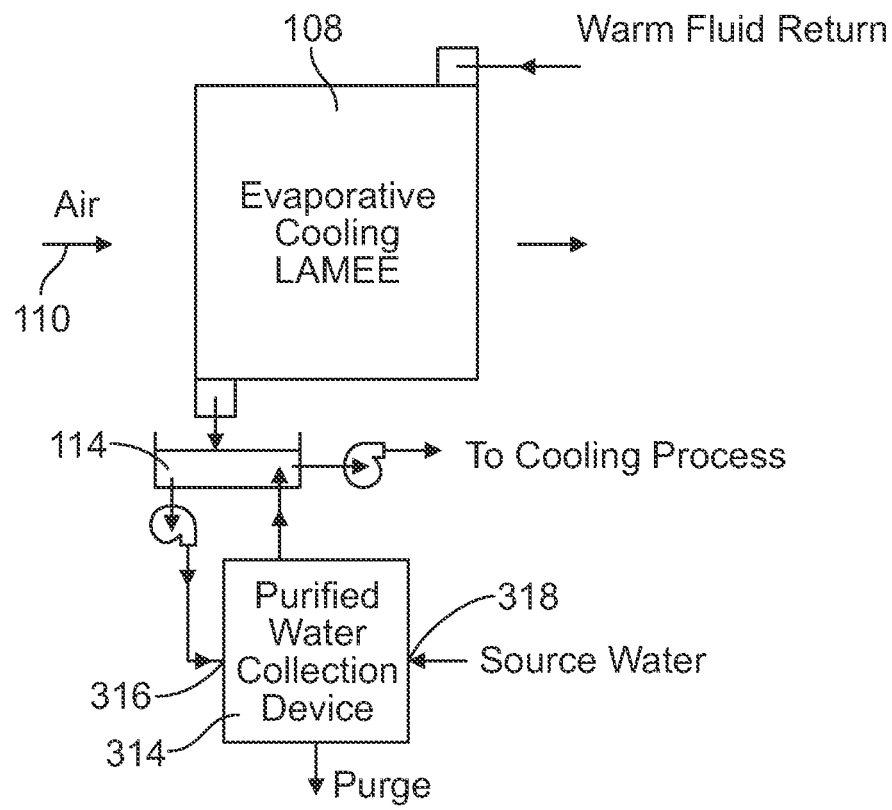
FIG. 3 is a schematic diagram of an embodiment of a water collection device coupled to an evaporative cooler LAMEE.

Referring now to FIG. 3, the evaporative cooling system 100 may also include a water collection device 314. The water collection device 314 may include a first inlet 316 to receive liquid desiccant cooling fluid 114 and a second inlet 318 to receive a water source. The water source may be potable or non-potable water, such as grey water, rain water, waste water from a process, or the like. Within the water collection device 314, the liquid desiccant acts as a draw solution to pull pure water from the source water into the cooling fluid 114. The water collection device 314 may include a membrane barrier that filters the water that is drawn from the source water. Therefore, pure water may be filtered from a non-potable source of water and used as a source of make-up water for the cooling fluid 114. Using the water collection device 314 to filter water sources to obtain pure water may prevent mineral build-up and deposition in the cooling fluid circuit.

In an embodiment, the water collection device 314 may be a liquid-to-liquid membrane exchanger that includes a membrane barrier used to filter the source water. In an alternative embodiment, the water collection device 314 may be a forward osmosis system that transfers the pure water to the cooling fluid 114 as make up water in the evaporative cooling system 100. Alternatively, the water collection device 314 may be a reverse osmosis, ion exchange, electrodialysis, vapor distillation, or other type of filtration system that directly adds make up water to the cooling fluid 114. The water collection device 314 may be connected to the tank 224 that holds the cooling fluid 114 through a recirculation line, as shown. In an alternative embodiment, the water collection device 314 may be positioned in-line with the main cooling fluid circuit. Optionally, the water collection device 314 may have a purge drain.

Referring again to FIG. 2, the temperature of the cooling fluid 114 increases in the cooling coil 112 by absorbing heat from the process air stream 104 that is directed across the cooling coil 112. After exiting the cooling coil 112, the cooling fluid 114 flows to the pre-conditioner 116. When the pre-conditioner 116 is used for pre-cooling, the cooling fluid 114 absorbs heat from the scavenger air stream 110 prior to the scavenger air stream 110 entering the evaporative cooler LAMEE 108. Thus, the cooling fluid 114 may have a higher temperature exiting the pre-conditioner 116 than at all other locations or stages along the cooling fluid circuit. If, however, the pre-conditioner 116 is used to pre-heat the scavenger air stream 110, as described above, then the highest temperature of the cooling fluid 114 along the cooling fluid circuit may occur prior to entering the pre-conditioner 116. From the pre-conditioner 116, the cooling fluid 114 flows to the fluid inlet 214 of the LAMEE 108 to complete the circuit and start a new cycle.

Although the cooling fluid 114 absorbs heat from both the process air and scavenger air streams 104, 110, the temperature increase of the cooling fluid 114 may be relatively minor since some of the heat is used as latent heat to vaporize the cooling fluid 114, and the cooling fluid 114 may also have a high heat capacity (e.g., due to the presence of water). For example, when the flow rates of the process air stream 104 and scavenger air stream 110 are approximately equal and the evaporative cooling system 100 provides the entire cooling load, the cooling fluid 114 may have a maximum temperature of about 80° F. and a minimum temperature of about 70° F., such that the temperature fluctuates only about 10° throughout the circuit. By comparison, the process air stream 104 may be cooled in the evaporative cooling system 100 from a return process air temperature of 104° F., for example, to a supply process air temperature of 75° F., which is a change of 29°.

As shown in FIG. 2, the scavenger air stream 110 enters a scavenger air plenum 202 at an inlet end 204. The scavenger air 110 may be drawn into the scavenger air plenum 202 by a fan 206 or another type of air stream modulator located within or proximate to the plenum 202. The fan 206 in the illustrated embodiment is located downstream of the LAMEE 108 in the direction of flow of the scavenger air stream 110. An output of the fan 206 may be controllable to adjust the volume of air 110 through the plenum 202 over time (e.g., the flow rate). Adjusting the flow rate of scavenger air 110 through the scavenger air plenum 202 may be used to control the amount of cooling attained by the evaporative cooling system 100. In the illustrated embodiment, the scavenger air stream 110 is cooled by the pre-conditioner 116 before being cooled further in the evaporative cooling LAMEE 108 downstream of the pre-conditioner 116. The scavenger air 110 is discharged from the scavenger air plenum 202 through an outlet end 222 as exhausted air. Optionally, the scavenger air 110 may be ushered through a heat exchanger and used to absorb some heat before being exhausted, such as shown in FIG. 1 with the AAHE 118 between the scavenger air stream 110 and the process air stream 104.

The process air stream 104 enters a process air plenum 228 at an inlet end 230. The process air stream 104 may be drawn and/or pushed by a fan 232 or other air stream modulator. The process air stream 104 interacts with the cooling coil 112 in the process air plenum 228. The process air stream 104 transfers heat to the cooling fluid 114 at the cooling coil 112, and then is discharged from an outlet end 234 of the plenum 228 as conditioned supply air that is directed to the air-conditioned space. For example, the process air stream 104 may be discharged to a data center, to a large hall, to a gym, to a room in a house, and the like. Optionally, the process air stream 104 may be pre-cooled upstream of the cooling coil 112 in a direction of flow of the process air stream 104 or post-cooled downstream of the cooling coil 112 to further reduce the temperature and/or humidity of the supplied process air stream 104.

Figure 4:
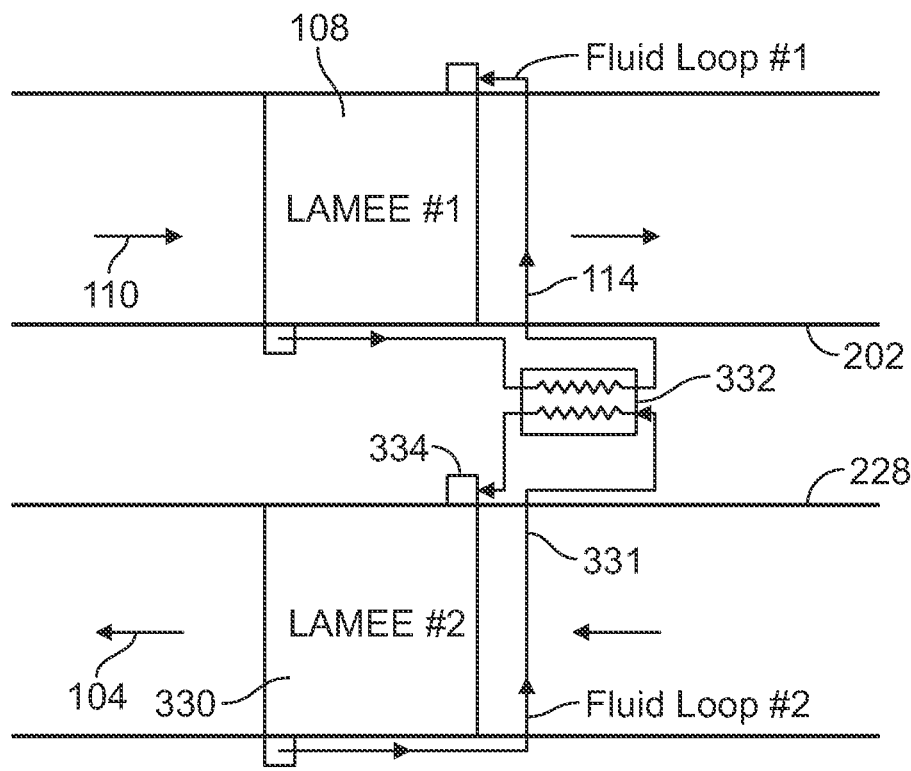
FIG. 4 is a schematic diagram of a second evaporative cooler LAMEE coupled to the evaporative cooler LAMEE shown in FIG. 3.

In an alternative embodiment shown in FIG. 4, a second evaporative cooler LAMEE 330 may be disposed in the process air plenum 228 instead of, or in addition to, the cooling coil 112 (shown in FIG. 2). The second evaporative cooler LAMEE 330 may be similar to the evaporative LAMEE 108 in the scavenger air plenum 202. For example, a cooling fluid 331 circulates through the second evaporative cooler LAMEE 330, where the cooling fluid 331 absorbs heat (e.g., latent heat) from the process air stream 104. A liquid-to-liquid heat exchanger (LLHE) 332 may be located between the second LAMEE 330 and evaporative cooler LAMEE 108. The cooling fluid 331 of the second LAMEE 330 that is being recirculated back to an inlet 334 of the second LAMEE 330 in a fluid loop may enter the LLHE 332, where the cooling fluid 331 transfers heat to the cooling fluid 114 of the evaporative cooler LAMEE 108. The cooling fluid 331 may be water, a liquid desiccant, or the like, and need not be the same as the cooling fluid 114 because the two fluids do not mix within the LLHE 332.

The cooling fluid 114 may enter the LLHE 332 after exiting the evaporative cooler LAMEE 108, when the cooling fluid 114 has the lowest relative temperature in the circuit. Directing the cooling fluid 114 through the LLHE 332 at the lowest temperature provides the most cooling (e.g., heat absorption) to the cooling fluid 331 of the second LAMEE 330, which is then used to cool the process air stream 104.

Figure 5:
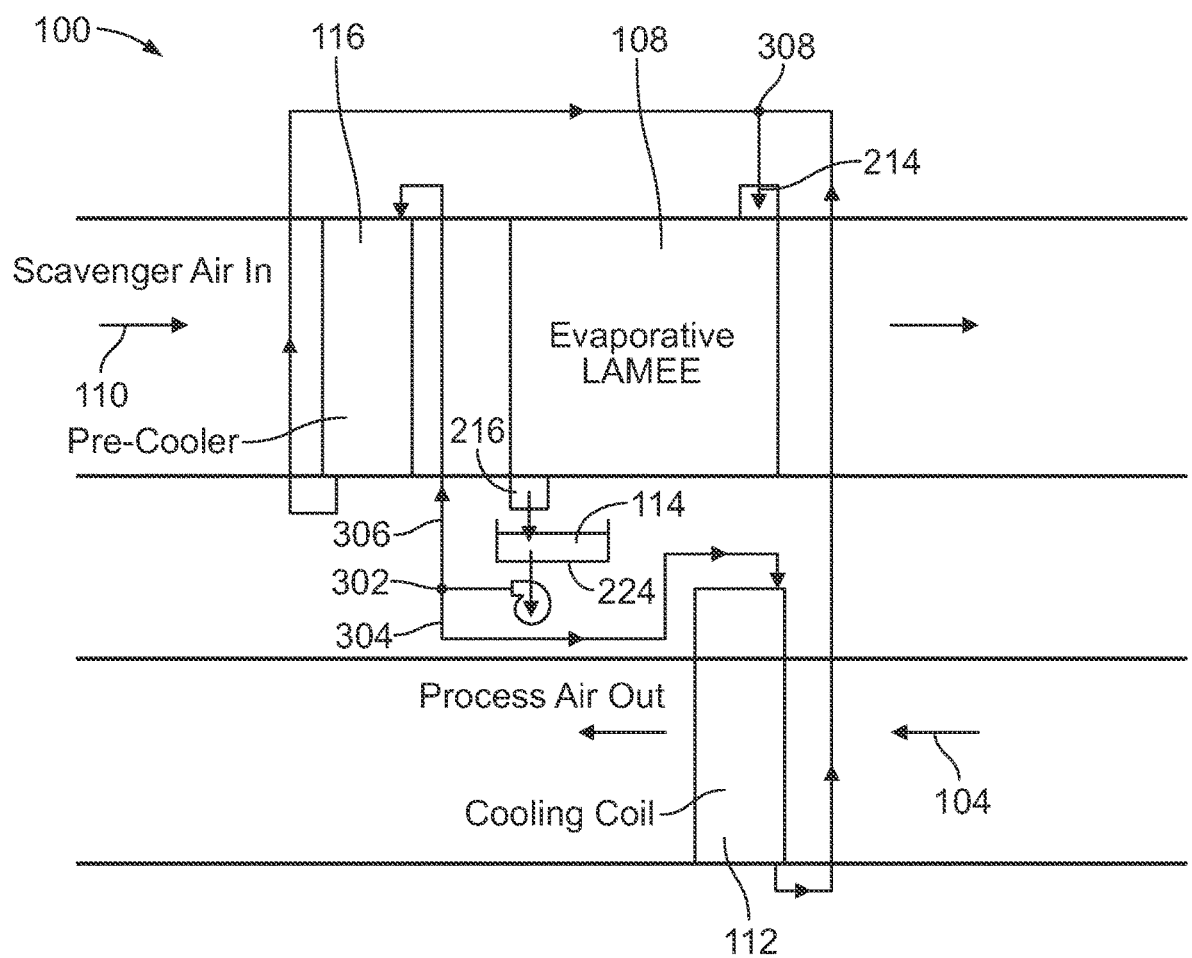
FIG. 5 is a schematic diagram of an embodiment of the evaporative cooling system shown in FIG. 1.

FIG. 5 is a schematic diagram of an embodiment of the evaporative cooling system 100 shown in FIG. 1. The embodiment of the cooling system 100 in FIG. 5 may be similar to the embodiment shown in FIG. 2, as the cooling system 100 includes cooling fluid 114 that circulates in a cooling fluid circuit between the evaporative cooler LAMEE 108, the cooling coil 112, and the pre-conditioner 116. The cooling fluid circuit may be formed of connected pipes, such as PVC or copper pipes. The pre-conditioner 116 and the LAMEE 108 provide cooling to the scavenger air stream 110, while the cooling coil 112 cools the process air stream 104. As shown in FIG. 5, after the cooling fluid 114 exits the fluid outlet 216 of the LAMEE 108 (and is optionally temporarily stored in a tank 224), the cooling fluid 114 may be pumped through a T-connector 302 in the cooling fluid circuit which splits the stream of cooling fluid 114. The T-connector 302 may be a T-shaped pipe fitting that branches one incoming stream of cooling fluid 114 into two outgoing streams. Alternatively, instead of using a T-connector 302, two separate pipe pathways may extend from the tank 224, such that one pathway leads to the cooling coil 112 and the other pathway leads to the pre-conditioner 116. Various possibilities exist for t-connectors, control valves, and circuit layouts to achieve different methods of control or fluid temperatures in the cooling coil 112 and/or pre-conditioner 116. For example, warm fluid 114 out of the cooling coil 112 may be mixed with cold fluid 114 from the tank 224 to adjust the temperature of the fluid 114 into the pre-conditioner 116 and thereby control the temperature of the scavenger air 110 entering the LAMEE 108.

In an embodiment, a first segment 304 of the cooling fluid circuit extending from the T-connector 302 connects to the cooling coil 112 to supply cooling fluid 114 to the cooling coil 112, similar to the embodiments shown in FIGS. 1 and 2. A second segment 306 of the circuit extends from the T-connector 302 directly to the pre-conditioner 116 to supply cooling fluid to the pre-conditioner 116. The fluid 114 exiting each of the cooling coil 112 and the pre-conditioner 116 may be routed towards the fluid inlet 214 of the LAMEE 108. Optionally, a second T-connector 308 may be used to recombine the two separate streams of the cooling fluid 114 prior to entering the LAMEE 108. The second T-connector 308 may be located near the fluid inlet 214.

Since the cooling fluid 114 leaving the LAMEE 108 may have the lowest temperature in the cooling fluid circuit, the T-connector 302 splits the stream of cooling fluid 114 to provide the lowest-temperature fluid 114 to both the cooling coil 112 and the pre-conditioner 116 simultaneously. This embodiment differs from the embodiment shown in FIG. 2, in which the cooling fluid 114 circulates through the cooling coil 112 before the pre-conditioner 116. Using the T-connector 302 provides the coldest cooling fluid 114 to the pre-conditioner 116, which may provide more pre-cooling of the scavenger air 110, potentially boosting the cooling of the system 100.

Figure 6:
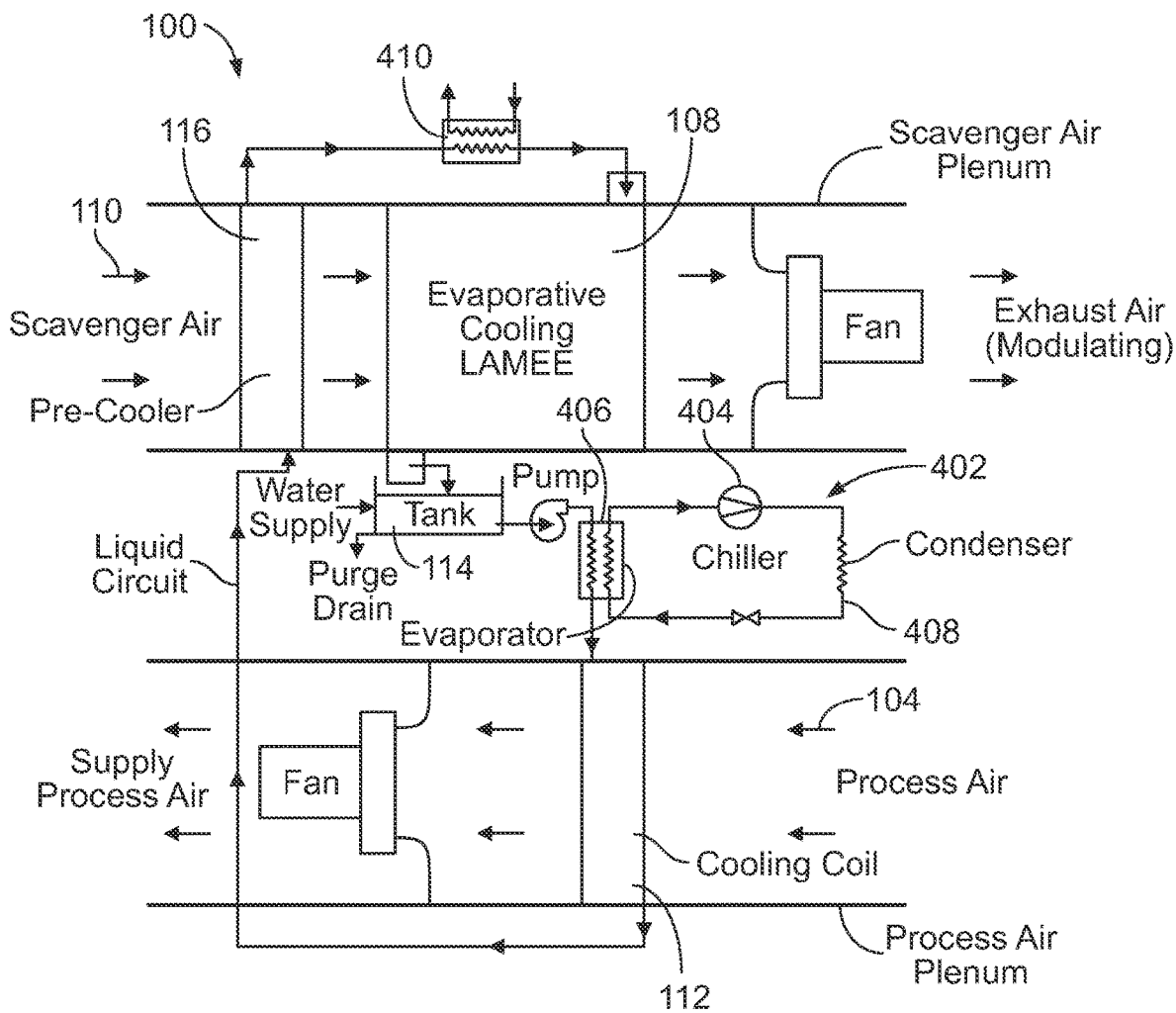
FIG. 6 is a schematic diagram of an embodiment of the evaporative cooling system shown in FIG. 1.

FIG. 6 is a schematic diagram of an embodiment of the evaporative cooling system 100 shown in FIG. 1. The embodiment shown in FIG. 6 includes a chiller 402 to boost the cooling potential of the system 100 when needed. The chiller 402 may be one or more refrigerant-to-liquid exchangers and a compressor 404. The chiller 402 also may include an evaporator 406 which absorbs heat from the cooling fluid 114, and a condenser 408 which rejects heat from the chiller 402. Alternatively, the chiller 402 may be an adsorption chiller, an absorption chiller, or another type of chiller which requires a heat input to generate cooling. The chiller 402 may be located in the system 100 between the LAMEE 108 and the cooling coil 112 so the cooled fluid 114 may be sub-cooled by the chiller 402 prior to entering the cooling coil 112. The sub-cooled cooling fluid 114 in the cooling coil 112 may cool the process air stream 104 to a lower temperature than if the cooling fluid 114 was not sub-cooled. The temperature of the process air stream 104 leaving the cooling coil 112 may be controlled at least partially by adjusting the chiller 402 to modify the temperature of the sub-cooled cooling fluid 114 entering the cooling coil 112. Alternatively, the chiller 402 or additional chillers may be disposed at a different location in the cooling system 100, such as between the cooling coil 112 and the pre-conditioner 116 to boost the pre-cooling of the scavenger air 110 through the pre-conditioner 116. Optionally, the chiller 402 may be a heat pump that is capable of selectively switching between cooling and heating modes. As such, the chiller 402 may be switched from providing cooling to providing heating when the heating mode is selected.

The chiller 402 provides supplemental cooling when necessary or desirable. The chiller 402 may be selectively controlled to operate occasionally depending on the present conditions (e.g., temperature and humidity) of the scavenger and return process air streams 110, 104, as well as the desired conditions of the supply process air stream 104 supplied to the space. In an embodiment, the heat from the chiller 402 may be discharged from the condenser 408 and/or transferred to the cooling fluid 114 prior to entering the LAMEE 108 via a refrigerant to liquid heat exchanger 410, as shown in FIG. 6. The added heat in the cooling fluid 114 will increase the amount of evaporative cooling in the LAMEE 108 and also keep condensing temperatures in the chiller 402 low. The chiller 402 may operate at a higher coefficient of performance by discharging heat to the fluid 114. Alternatively, the heat from the chiller 402 may be discharged at another location and/or to another medium, such as to the ambient air or to the air exiting the evaporative cooler LAMEE 108.

Figure 7:
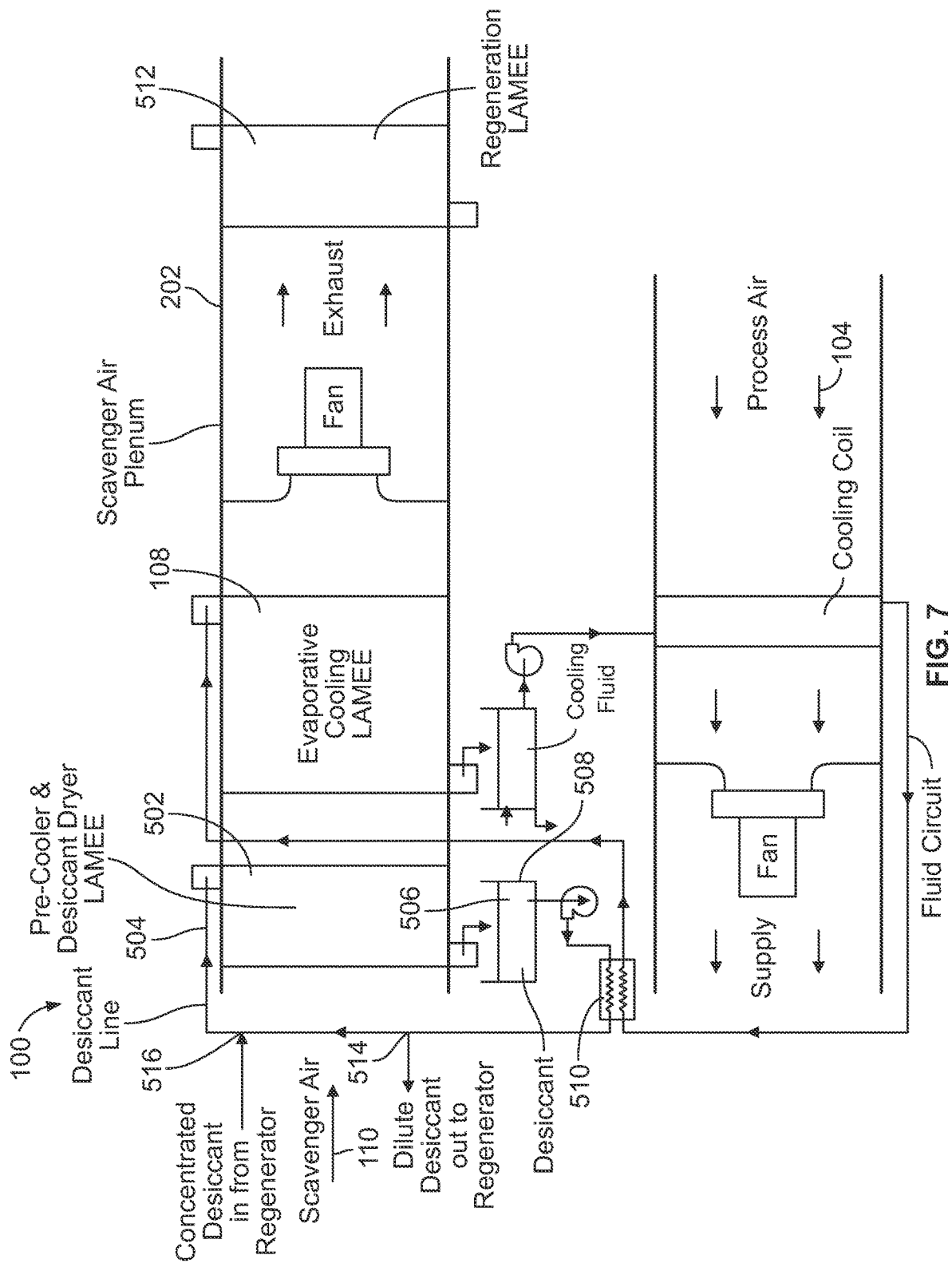
FIG. 7 is a schematic diagram of an embodiment of the evaporative cooling system shown in FIG. 1.

FIG. 7 is a schematic diagram of an embodiment of the evaporative cooling system 100 shown in FIG. 1. As shown in FIG. 7, the system 100 may include a dehumidification LAMEE 502 upstream of the evaporative cooler LAMEE 108 in the scavenger air plenum 202 to reduce the humidity of the scavenger air stream 110 prior to evaporative cooling in the evaporative cooler LAMEE 108. Pre-drying the scavenger air stream 110 further boosts the cooling potential in the system 100 because humidity in an air stream may limit the amount of cooling achievable through evaporative cooling. The dehumidification LAMEE 502 may also pre-cool the scavenger air stream 110 and may replace the pre-conditioner 116 shown in FIG. 5. In an alternative embodiment, the dehumidification LAMEE 502 may be located upstream of both the pre-conditioner 116 and the evaporative cooler LAMEE 108. Desiccant dehumidification allows even lower process air stream 104 temperatures with little additional energy input to the system 100. As described below, the energy added may be in the form of heat to dry the desiccant.

The dehumidification LAMEE 502 may be similar in construction to the evaporative cooler LAMEE 108. However, in an embodiment, the dehumidification LAMEE 502 is incorporated with a desiccant line 504 that circulates a liquid desiccant fluid 506. The desiccant fluid 506 may be a lithium chloride salt solution or another liquid desiccant solution known in the art. The desiccant fluid 506 may absorb both heat and moisture from the scavenger air stream 110 within the LAMEE 502. Optionally, the desiccant fluid 506 is discharged from the LAMEE 502 into a desiccant tank 508. From the tank 508, the desiccant fluid 506 may be pumped through a liquid-to-liquid heat exchanger 510. Within the heat exchanger 510, heat from the desiccant fluid 506 may be transferred to the cooling fluid 114 that is circulated towards the evaporative cooler LAMEE 108. The cooled desiccant fluid 506 may be recirculated back to the dehumidification LAMEE 502.

The desiccant fluid 506 may have a different composition than the cooling fluid 114 that circulates within the evaporative cooler LAMEE 108. For example, the desiccant fluid 506 may be a lithium chloride solution, while the cooling fluid 114 may be pure water. As a result, the desiccant fluid 506 is circulated in a circuit that is separate from the cooling fluid 114 to prevent the fluids 506, 114 from mixing. The only interaction between the fluids 506, 114 may be within the heat exchanger 510 where heat transfer takes place.

During operation, the desiccant fluid 506 may dilute due to absorbed moisture, which reduces the concentration of the desiccant in the fluid 506 and, therefore, the drying ability of the dehumidification LAMEE 502. The cooling system 100 may include a regeneration system to concentrate the desiccant fluid 506. The regeneration system may control the concentration of the liquid desiccant within the dehumidification LAMEE 502. For example, the regeneration system may be used to vary the concentration of the liquid desiccant in the desiccant fluid 506 to adjust the humidity of the scavenger air stream 110 that exits the dehumidification LAMEE 502 and enters the evaporative cooler LAMEE 108. By adjusting the humidity of the scavenger air stream 110, the amount of cooling of the cooling fluid 114 and/or the scavenger air stream 110 within the evaporative cooler LAMEE 108 may be varied.

The regeneration system may be a regeneration LAMEE 512 located in the scavenger air plenum 202 downstream of the evaporative cooler LAMEE 108. Alternatively, the regeneration system may be remotely located. An outlet port 514 in a desiccant fluid circuit that circulates the desiccant fluid 506 may be used to purge some desiccant fluid 506 and direct the fluid 506 to the regeneration system. The regeneration system may be a water removal device such that moisture is removed from the desiccant fluid 506 by heating or non-heat processes such as filtering, membrane distillation, vacuum processes, and/or chemical processes. As the moisture is removed, the concentration of the desiccant in the desiccant fluid 506 increases. In an embodiment, the regeneration system may be a regeneration LAMEE 512.

The moisture from the desiccant fluid 506 may be released to the scavenger air stream 110 that is exhausted from the cooling system 100. Thus, the exhausted scavenger air stream 110 leaving the cooling system 100 may be warm and dense. The concentrated desiccant fluid 506 exiting the regeneration system (for example, the LAMEE 512) may reenter the desiccant fluid circuit via an inlet port 516. Alternatively or in addition to using a regeneration system, the concentration of the desiccant fluid 506 may be increased by introducing a concentrated desiccant into the desiccant fluid storage tank 508.

Figure 8:
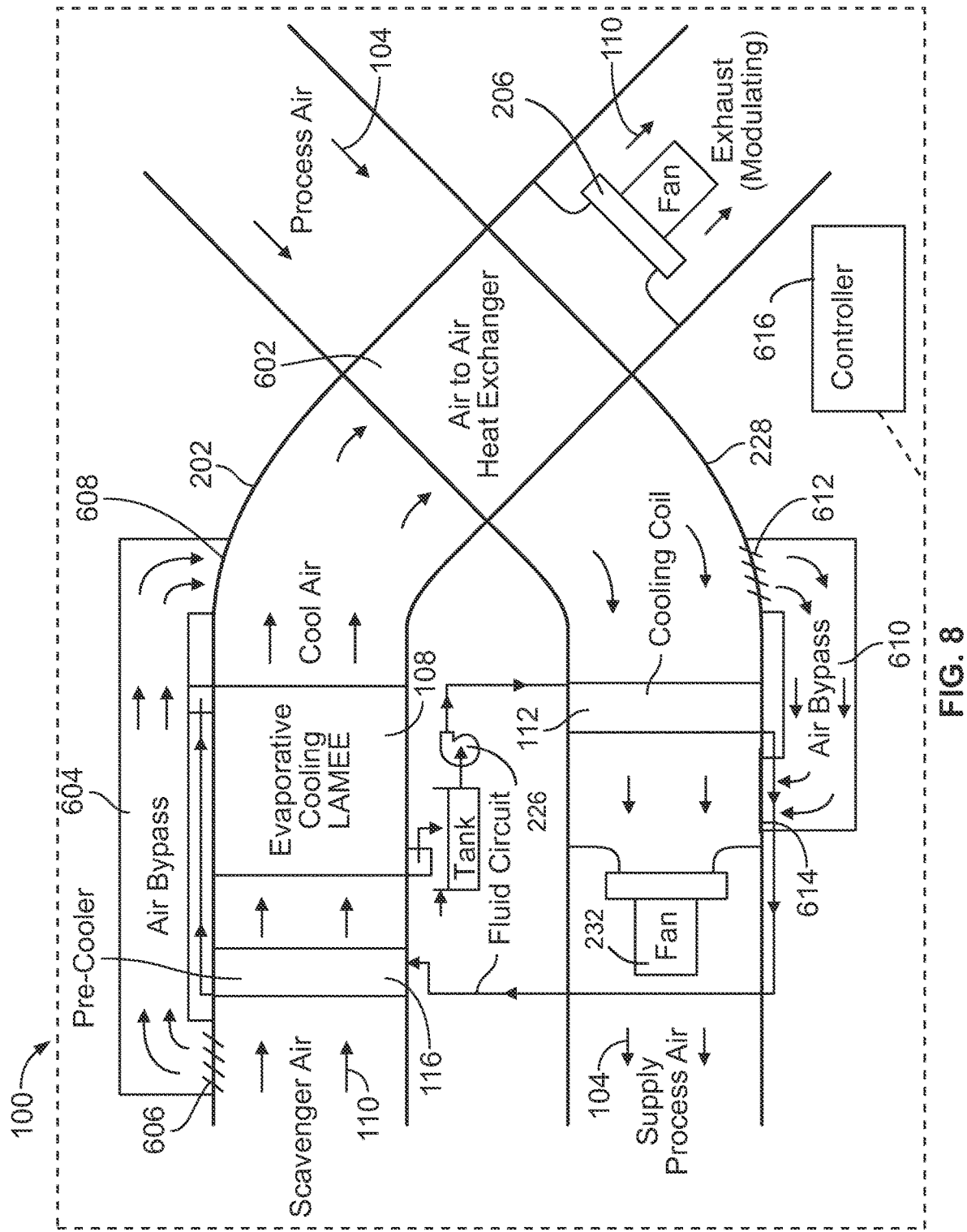
FIG. 8 is a schematic diagram of an embodiment of the evaporative cooling system shown in FIG. 1.
Figure 9:
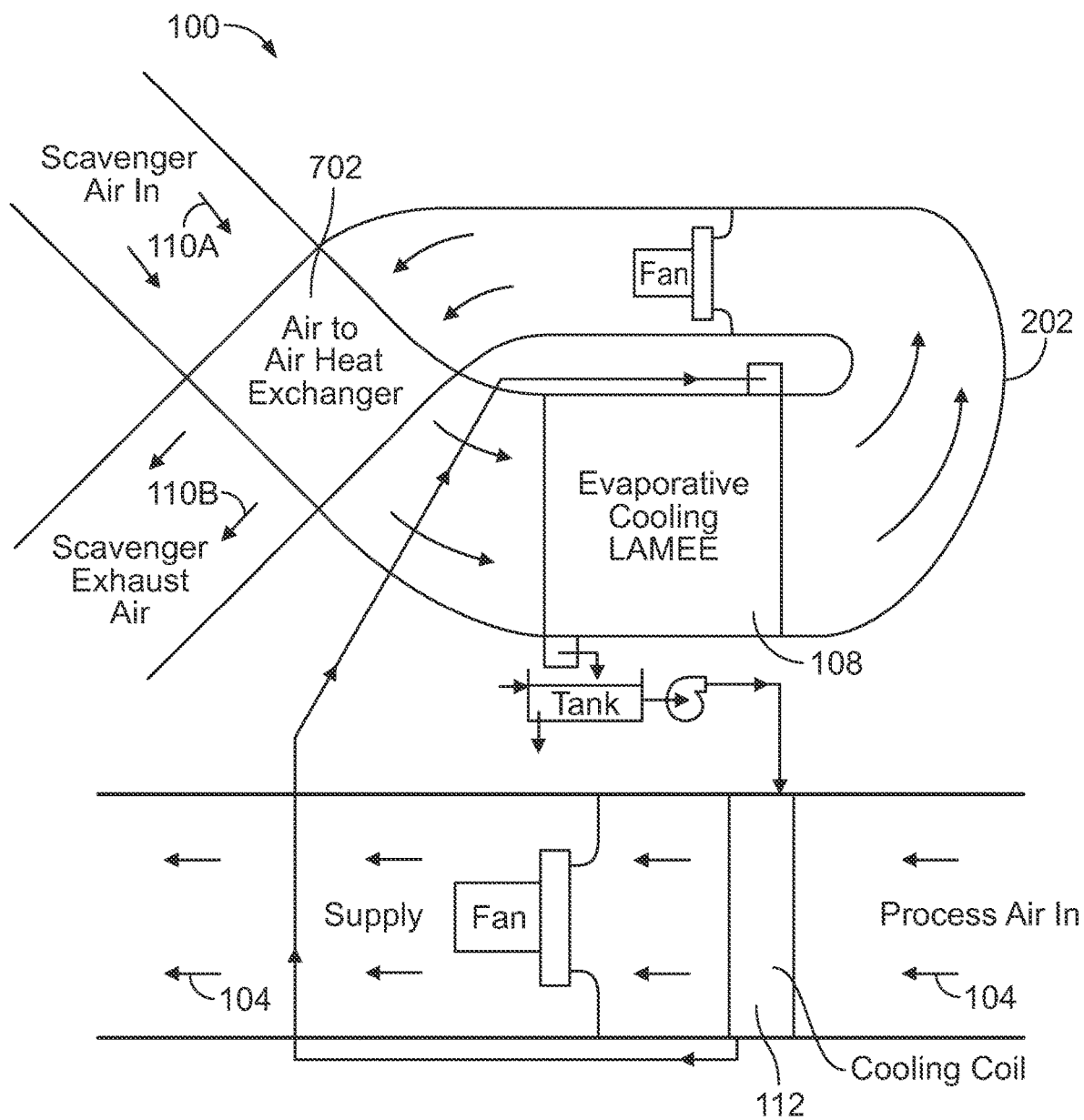
FIG. 9 is a schematic diagram of an embodiment of the evaporative cooling system shown in FIG. 1.

FIGS. 8 and 9 illustrate ways of using the scavenger air stream 110 downstream of the evaporative LAMEE 108 for additional cooling prior to being exhausted from the cooling system 100.

FIG. 8 is a schematic diagram of an embodiment of the evaporative cooling system 100 shown in FIG. 1. FIG. 8 illustrates how the scavenger air stream 110 downstream of the evaporative LAMEE 108 may be used to pre-cool the return process air stream 104 before the process air stream 104 reaches the cooling coil 112. The cooling system 100 includes an air-to-air heat exchanger (AAHE) 602 that allows for heat transfer between the scavenger and process air streams 110, 104. The AAHE 602 may be configured to recover cooling from the evaporative cooler LAMEE 108 to increase the system efficiency and cooling capacity.

In an embodiment, the AAHE 602 may be located within the scavenger air plenum 202 downstream of the evaporative cooler LAMEE 108 in the direction of travel of the scavenger air stream 110 and within the process air plenum 228 upstream of the cooling coil 112 in the direction of travel of the process air stream 104. The scavenger and process air streams 110, 104 may enter the AAHE 602 in a cross-flow orientation. Alternatively, the orientation may be counter-flow or another relative orientation. The AAHE 602 may be configured to allow the transfer of heat between the air streams 110, 104 but not contaminants or other particles or molecules having mass. For example, the AAHE 602 may include membrane barriers between the air streams 110, 104 that are impermeable but are conductive to heat transfer. The AAHE 602 may be a plate heat exchanger, heat wheel, heat pipe, a run-around heat recovery system, or the like.

For example, the scavenger air 110 exiting the LAMEE 108 may be cooled to a temperature of 80° F. relative to an outside air temperature of 95° F. Instead of discharging the cooled scavenger air 110 to the environment, the scavenger air 110 is directed through the AAHE 602, where the cooled scavenger air 110 absorbs heat from the return process air stream 104. The cooling potential of the process air stream 104 through the AAHE 602 is significant, as a return process air stream 104 with a temperature of 104° F., for example, may be pre-cooled by the AAHE 602 to a temperature of 83° F. prior to reaching the cooling coil 112. Such pre-cooling using the exhaust scavenger air stream 110 allows the process air stream 104 supplied to the space to achieve a lower temperature than would be achievable using the cooling coil 112 alone.

In an embodiment, the cooling system 100 may have multiple bypass routes to allow the air streams 110, 104 to bypass various components of the cooling system 100 when desired. For example, a first air bypass route 604 located in or along the scavenger air plenum 202 may direct the scavenger air stream 110 around the pre-conditioner 116 and the evaporative LAMEE 108. The first air bypass route 604 has an air inlet 606 upstream of the pre-conditioner 116 and an air outlet 608 downstream of the LAMEE 108. The air inlet and outlet 606, 608 may have dampers or other bypass devices that may be closed to block entrance to the bypass route 604 when the evaporative LAMEE 108 and pre-conditioner 116 are functioning to cool the scavenger air stream 110. A second air bypass route 610 located in or along the process air plenum 228 may direct the process air stream 104 around the cooling coil 112. The second air bypass route 610 has an air inlet 612 and an air outlet 614, and each may have dampers that restrict access to the bypass route 610 while the cooling coil 112 is functioning to cool the process air stream 104.

For example, when the scavenging air stream 110 from the outside air is cool enough as is to provide adequate cooling to the process air 104, the evaporative LAMEE 108, cooling coil 112, and pre-conditioner 116 may be shut down because additional cooling of the scavenger air 110 is not needed. The scavenger air 110 may be directed through the first air bypass route 604 and the process air stream 104 may be directed through the second air bypass route 610 to bypass the non-operating components. The scavenger air 110, still at the temperature of the outside air, is directed to the AAHE 602, and the cool scavenger air 110 absorbs heat from the hot return process air stream 104 to cool the process air stream 104 by free cooling. Thus, when the scavenger air 110 is cool enough, the AAHE 602 may handle the full cooling load.

Optionally, the cooling system 100 may include one or more mixing locations where the process air stream 104, which may be dryer than the scavenger air 110, is mixed with the scavenger air stream 110. The addition of dryer air depresses the wet bulb temperature of the scavenger air stream 110, which may allow the cooling system 100 to achieve lower temperatures. For example, process air 104 may be mixed with scavenger air 110 in the scavenger air plenum 202 upstream of the pre-conditioner 116 and/or between the pre-conditioner and the evaporative cooler LAMEE 108.

The cooling system 100 may also include one or more make up locations where fresh outside air (e.g., scavenger air 110) is added to the process air stream 104 in the process air plenum 228. Adding some amount of fresh air to a space may be a requirement for some buildings, and the air may come from a fresh air unit (not shown). For example, fresh air may be added to the process air stream 104 at any location, including upstream of the AAHE 602, between the AAHE 602 and the cooling coil 112, and/or downstream of the cooling coil 112.

In the illustrated embodiment, the cooling system 100 includes a controller 616. The controller 616 may be communicatively coupled to one or more components of the system 100. The controller 616 may be used to automatically or semi-automatically adjust the parameters of the evaporative cooling system 100 to control the amount of cooling (or heating) provided to the process air stream 104. For example, the controller 616 may be configured to control the output of the fans 206, 232 to adjust the flow rate of the scavenger air stream 110 and the process air stream 104, respectively. The controller 616 may also control the pump 226 in order to adjust the flow rate of the cooling fluid 114 through the fluid circuit. In addition, the dampers at the respective air inlets 606, 612 of the first and second air bypass routes 604, 610 may be controlled by the controller 616 to selectively divert the air streams 110, 104 around various components of the system 100.

The details of the design of the controller 616 are not critical to the present inventive subject matter. Rather, any suitable off-the-shelf controller 616 may be used that performs the operations described herein. The controller 616 may include any processor-based or microprocessor-based system including systems using microcontrollers, reduced instruction set computers (RISC), ASICs, logic circuits, and any other circuit or processor capable of executing the functions described herein. The controller 616 may represent hardware and associated instructions, such as software stored on a tangible and non-transitory computer readable storage medium (for example, computer hard drive, ROM, RAM, or the like) that perform the operations described herein. The controller 616 may be a logic-based device that includes electronic circuits. Optionally, the controller 616 may be configured to execute one or more algorithms to perform the control functions described herein automatically or semi-automatically with operator assistance.

FIG. 9 is a schematic diagram of an embodiment of the evaporative cooling system 100 shown in FIG. 1. FIG. 9 illustrates how the scavenger air stream 110 downstream of the evaporative LAMEE 108 may be used to pre-cool the scavenger air stream 110 upstream of the LAMEE 108. For example, the scavenger air 110 may include both a scavenger air supply stream 110A that is upstream of the LAMEE 108 and a scavenger air exhaust stream 110B that is downstream of the LAMEE 108. The cooling system 100 includes an air-to-air heat exchanger (AAHE) 702 that allows the scavenger air supply 110A to transfer heat to the cool scavenger exhaust air 110B, which has been cooled via the evaporative LAMEE 108. The AAHE 702 may be configured to recover cooling from the evaporative cooler LAMEE 108 to increase the system efficiency and cooling capacity, lowering the achievable cooling fluid temperature through the cooling coil 112. More specifically, the AAHE 702 acts as a pre-conditioner by using the cooled scavenger exhaust air 110B to pre-cool the scavenger air supply stream 110A. Optionally, although not shown in FIG. 9, the cooling system 100 may include a separate pre-conditioner 116 (shown in FIG. 8) upstream of the AAHE 702 or between the AAHE 702 and the LAMEE 108.

As shown in FIG. 9, the scavenger air plenum 202 may connect to the AAHE 702 upstream of the LAMEE 108 and may also double-back to connect to the AAHE 702 again. For example, a downstream portion of the scavenger air plenum 202 that is downstream of the evaporative cooler LAMEE in a direction of flow of the scavenger air stream 110 may be at least one of curved or angled to be at least proximate to an upstream portion of the scavenger air plenum 202 that is upstream of the LAMEE 108. As such, the scavenger air plenum 202 may have an alpha-loop configuration. Optionally, the upstream portion of the plenum 202 may be curved or angled in addition to, or instead of, the downstream portion of the plenum 202. The AAHE 702 is disposed at least partially within both the downstream portion and the upstream portion of the scavenger air plenum 202 to allow the scavenger air exhaust stream 110B to absorb heat from the scavenger air supply stream 110A prior to the supply stream 110A entering the LAMEE 108. The scavenger exhaust air 110B may enter the AAHE 702 in a cross-flow orientation relative to the scavenger air supply 110A. In alternative embodiments other orientations of the scavenger air streams 110A, 110B may be used.

An alpha-loop configuration may be useful in residential applications in addition to commercial applications. For example, using an alpha-loop configuration of the scavenger air plenum 202, the outside air may not need to be drawn or forced into the building because the LAMEE 108 and AAHE 702 may be proximate to the outside. With this configuration, only cooling fluid lines, and not scavenger air ducts, may be required for installation inside the building. The cooling fluid lines supply cooling fluid to the cooling coil 112 within the ducts that recirculate the process air stream 104.

As an alternative to curving the scavenger air plenum 202 in an alpha-loop configuration as shown in FIG. 9, the AAHE 702 may be a heat pipe that extends across the evaporative cooler LAMEE 108 from a back of the LAMEE 108 proximate to the air outlet to a front of the LAMEE 108 proximate to the air inlet. For example, the AAHE 702 may be a wrap-around heat pipe or a side-by-side heat pipe. The AAHE 702 uses the cooled scavenger exhaust air 110B exiting the air outlet of the evaporative cooler LAMEE 108 to pre-cool the scavenger supply air 110A prior to entering the air inlet of the evaporative cooler LAMEE 108. In another embodiment, the AAHE 702 may be a run-around heat recovery system that uses two liquid-to-air heat exchangers with a heat transfer fluid (for example, glycol) pumped in a closed circuit between the two exchangers to transfer heat between two air streams. Thus, one liquid-to-air heat exchanger may be located downstream of the evaporative cooler LAMEE 108 and the other may be located upstream of the LAMEE 108 in order to allow the scavenger exhaust air stream 110B to absorb heat from the scavenger supply air stream 110A.

Figure 10:
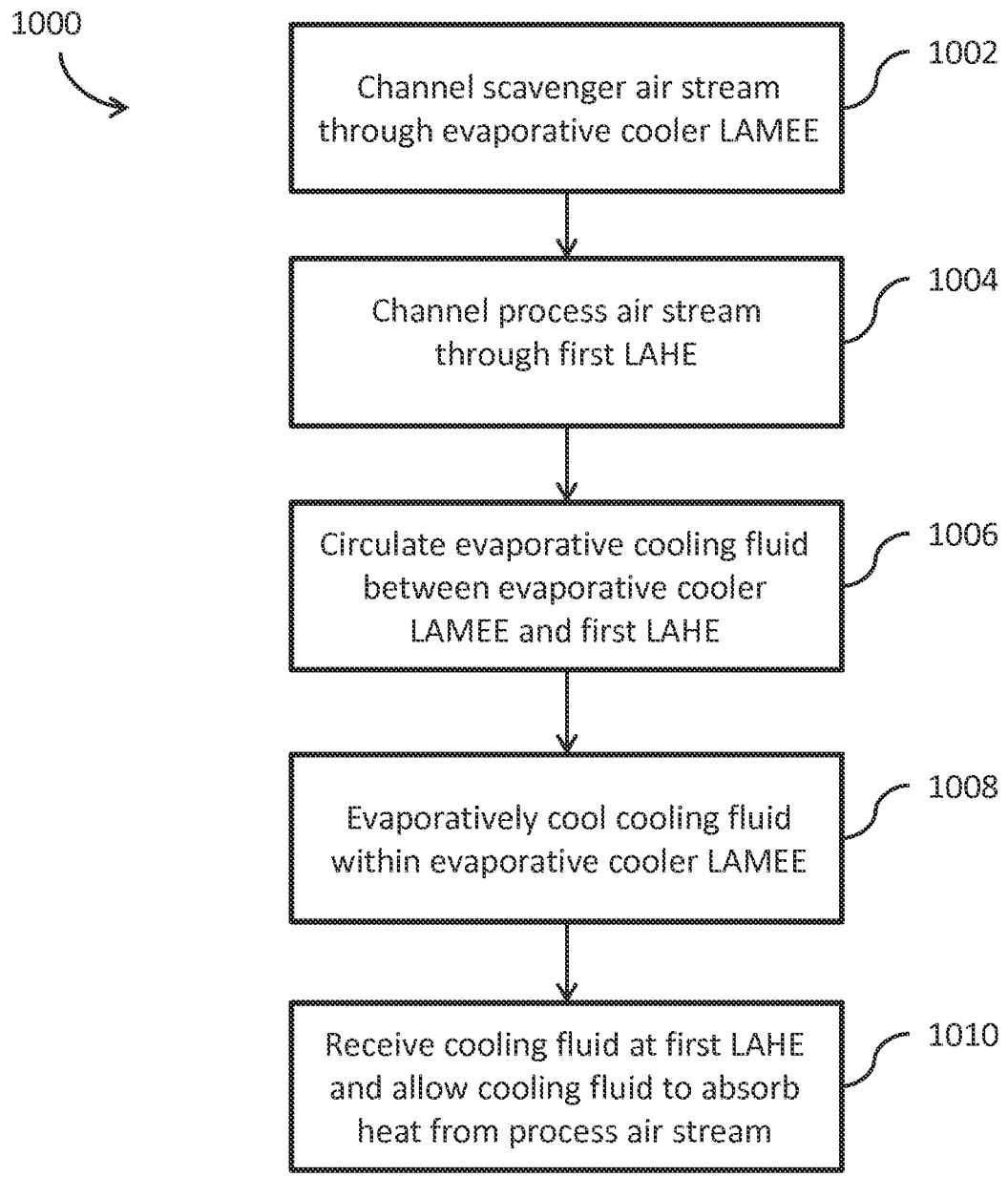
FIG. 10 is a flow diagram of an evaporative cooling method in accordance with an embodiment.

FIG. 10 is a flow diagram of an evaporative cooling method 1000 in accordance with an embodiment. The evaporative cooling method 1000 may be performed by or using one or more of the embodiments of the evaporative cooling system 100 shown and described in FIGS. 1-9. At 1002, a scavenger air stream is channeled through an evaporative cooler liquid-to-air membrane energy exchanger (LAMEE) that is disposed within a scavenger air plenum. At 1004, a process air stream is channeled through a first liquid-to-air heat exchanger (LAHE) that is disposed within a process air plenum. The flow rate of the scavenger air stream through the scavenger air plenum and/or the process air stream through the process air plenum may be adjusted to modify an amount of cooling of the process air stream. For example, one or more fans in the scavenger air plenum and/or the process air plenum may be used to control the flow rate. Optionally, when evaporative cooling is not necessary (for example, based on a current condition of the scavenger air stream and/or the process air stream), the method 100 may include diverting the scavenger air stream around the evaporative cooler LAMEE through a first air bypass route and diverting the process air stream around the first LAHE through a second air bypass route Optionally, a scavenger air exhaust stream of the scavenger air stream that exits the evaporative cooler LAMEE may be channeled to an air-to-air heat exchanger (AAHE) disposed in the scavenger air plenum. The AAHE may be configured to additionally receive at least one of the process air stream upstream of the first LAHE in a direction of flow of the process air stream or a scavenger air supply stream of the scavenger air stream upstream of the evaporative cooler LAMEE in a direction of flow of the scavenger air stream. The AAHE may be further configured to allow the scavenger air exhaust stream to absorb heat from the at least one of process air stream or scavenger air supply stream to pre-cool the at least one air stream. For example, the AAHE may utilize the cooled scavenger air exhaust stream exiting the evaporative cooler LAMEE to provide additional cooling to the process air stream and/or the scavenger air supply stream, instead of merely exhausting the scavenger air exhaust stream.

At 1006, an evaporative cooling fluid is circulated between the evaporative cooler LAMEE and the first LAHE through a cooling fluid circuit. For example, the cooling fluid may be directed through the evaporative cooler LAMEE, and the cooling fluid discharged from the evaporative cooler LAMEE may be directed to the first LAHE.

The cooling fluid circuit may be configured to cycle the cooling fluid back to the evaporative cooler LAMEE after exiting the first LAHE.

Optionally, the circulating operation 1006 may further include circulating the cooling fluid to a water collection device disposed along the cooling fluid circuit. The water collection device may be configured to receive the cooling fluid through a first inlet and a water source through a second inlet. The water collection device may have a membrane barrier that is configured to separate the cooling fluid from the water source while allowing a transfer of pure water across the membrane barrier in a direction from the water source to the cooling fluid.

Optionally, the circulating operation 1006 may further include circulating the cooling fluid to a second LAHE disposed within the scavenger air plenum upstream of the evaporative cooler LAMEE in a direction of flow of the scavenger air stream. The second LAHE may be configured to receive the cooling fluid from at least one of the evaporative cooler LAMEE or the first LAHE and to allow the cooling fluid to absorb heat from the scavenger air stream to prior to the scavenger air stream entering the evaporative cooler LAMEE.

At 1008, the cooling fluid is evaporatively cooled within the evaporative cooler LAMEE utilizing the scavenger air stream. The evaporative cooler LAMEE may evaporatively cool the cooling fluid by allowing the cooling fluid to evaporate into the scavenger air stream, such that the vapor of the evaporated cooling fluid enters the scavenger air stream. The evaporative cooler LAMEE may include separate channels configured to receive the scavenger air stream and the cooling fluid. The separate channels may be divided by membrane separation layers that include a semi-permeable membrane. The semi-permeable membrane may be configured to allow the transfer of heat and vapor across the membrane but not the transfer of at least one of solids or liquids across the membrane.

At 1010, the cooling fluid is received at the first LAHE from the evaporative cooler LAMEE. At or within the first LAHE, the cooling fluid is allowed to absorb heat from the process air stream to cool the process air stream. The cooled process air stream may be discharged from the first LAHE as conditioned supply air and directed to an enclosed space (e.g., to condition the air in the space).

Optionally, the evaporative cooling method 1000 may further include channeling the scavenger air stream through a dehumidification LAMEE disposed in the scavenger air plenum upstream of the evaporative LAMEE in a direction of flow of the scavenger air stream. A liquid desiccant fluid may be circulated through the dehumidification LAMEE. The dehumidification LAMEE may be configured to allow the liquid desiccant fluid to absorb at least one of moisture or heat from the scavenger air stream within the dehumidification LAMEE to reduce at least one of the humidity or the temperature of the scavenger air stream prior to entering the evaporative cooler LAMEE. The method 1000 may further include selectively adjusting a concentration of the liquid desiccant fluid to modify at least one of the humidity or the temperature of the scavenger air stream prior to entering the evaporative cooler LAMEE. Optionally, the circulating operation 1006 may further include circulating the cooling fluid to a liquid-to-liquid heat exchanger (LLHE) coupled to the cooling fluid circuit downstream of the first LAHE in a direction of flow of the cooling fluid. The LLHE may be configured to receive the liquid desiccant fluid from the dehumidification LAMEE and allow the liquid desiccant fluid to transfer heat to the cooling fluid prior to the cooling fluid entering the evaporative cooler LAMEE.

Optionally, the circulating operation 1006 may further include circulating the cooling fluid to a chiller disposed along the cooling fluid circuit between the evaporative cooler LAMEE and the first LAHE. The evaporative cooling method 1000 may further include selectively operating the chiller to provide additional cooling of the cooling fluid prior to the cooling fluid entering the first LAHE when the chiller is operating. In addition, when operating, the chiller output may be modulated depending on the actual and desired air conditions.

One or more embodiments of the system herein provide the technical effect of achieving lower cooling temperatures than existing evaporative cooling systems and equipment. One or more embodiments of the system herein provide the technical effect of operating successfully in a wide range of locations with varying climates and for a significant number of days in the year (e.g., year round). For example, the embodiments of the system described herein may be successfully implemented in applications that require lower temperatures, where conventional evaporative cooling systems are inapplicable for not being able to realize the required temperatures. One or more embodiments of the system herein provide the technical effect of achieving high overall and operating efficiencies, especially compared to existing evaporative systems that require energy-intensive back-up cooling equipment to handle peak loads, for example. In addition, one or more embodiments of the system herein provide the technical effect of accomplishing the described cooling and energy efficiencies using a cost-effective system design that does not require expensive, technically complex, and/or redundant cooling equipment.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the invention without departing from their scope. While the dimensions and types of materials described herein are intended to define the parameters of the various embodiments of the invention, the embodiments are by no means limiting and are exemplary embodiments. Many other embodiments will be apparent to those of skill in the art upon reviewing the above description. The scope of the various embodiments of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f) or (pre-AIA) 35 U.S.C. § 112, sixth paragraph, unless and until such claim limitations expressly use the phrase "means for" followed by a statement of function void of further structure.

What is claimed is:

1. An evaporative cooling system comprising:
an evaporative cooler liquid-to-air membrane energy exchanger (LAMEE) disposed within a scavenger air plenum that is configured to channel a scavenger air stream, the evaporative cooler LAMEE comprising one or more semi-permeable membranes and being configured to direct water and the scavenger air stream through one or more separate channels divided by the one or more semi-permeable membranes, the evaporative cooler LAMEE being configured to exchange latent and sensible energy between the scavenger air stream and the water without exchanging energy between the scavenger air stream and any other liquid;
a first liquid-to-air heat exchanger (LAHE) disposed within a process air plenum that is configured to channel a process air stream;
a fan disposed within the scavenger air plenum, the fan being configured to vary a rate of flow of the scavenger air stream to modify an amount of cooling of the process air stream; and
a closed cooling liquid circuit that is configured to circulate the water between the evaporative cooler LAMEE and the first LAHE, wherein the evaporative cooler LAMEE is configured to utilize the scavenger air stream to evaporatively cool the water, and wherein the first LAHE is configured to receive the water from the evaporative cooler LAMEE and to allow the water to absorb heat from and cool the process air stream, and
wherein the scavenger air plenum comprises a scavenger air inlet and a scavenger air outlet, wherein outside air enters the scavenger air inlet as the scavenger air stream, wherein the scavenger air stream is channeled through the scavenger air plenum and is discharged outside of an enclosed space through the scavenger air outlet, wherein the process air plenum comprises a process air inlet and a process air outlet, wherein return air from the enclosed space enters the process air inlet as the process air stream, and wherein the process air stream is channeled through the process air plenum and is discharged into the enclosed space through the process air outlet as conditioned supply air.

2. The evaporative cooling system of claim 1, wherein the first LAHE is configured to discharge the process air stream as conditioned supply air that is directed to the enclosed space.

3. The evaporative cooling system of claim 1, further comprising a second LAHE disposed within the scavenger air plenum upstream of the evaporative cooler LAMEE in a direction of flow of the scavenger air stream, the second LAHE configured to receive the water from at least one of the evaporative cooler LAMEE or the first LAHE and to allow heat transfer between the water and the scavenger air stream upstream of the evaporative cooler LAMEE.

4. The evaporative cooling system of claim 3, wherein the cooling fluid circuit is configured to divide the cooling fluid exiting the evaporative cooler LAMEE between a first pathway that directs a first stream of the cooling fluid to the first LAHE and a second pathway that directs a second stream of the cooling fluid to the second LAHE.

5. The evaporative cooling system of claim 1, further comprising a water collection device disposed along the cooling liquid circuit, the water collection device configured to receive the water through a first inlet and a water source through a second inlet, the water collection device having a membrane barrier that is configured to separate the water from the water source while allowing a transfer of pure water across the membrane barrier from the water source into the water.

6. The evaporative cooling system of claim 1, wherein the first LAHE is a second evaporative cooler LAMEE.

7. The evaporative cooling system of claim 1, further comprising a chiller disposed along the cooling liquid circuit between the evaporative cooler LAMEE and the first LAHE, the chiller selectively operable to provide additional cooling of the water prior to entering the first LAHE when the chiller is operating.

8. The evaporative cooling system of claim 1, further comprising a dehumidification LAMEE disposed in the scavenger air plenum upstream of the evaporative cooler LAMEE in a direction of flow of the scavenger air stream, the dehumidification LAMEE configured to circulate a liquid desiccant fluid to allow the scavenger air stream flowing through the dehumidification LAMEE to reduce at least one of humidity or temperature prior to entering the evaporative cooler LAMEE.

9. The evaporative cooling system of claim 8, wherein the dehumidification LAMEE is configured to discharge the liquid desiccant fluid to a liquid-to-liquid heat exchanger (LLHE) that is coupled to the cooling fluid circuit, the LLHE configured to allow heat transfer from the liquid desiccant fluid to the cooling fluid of the cooling fluid circuit prior to the cooling fluid entering the evaporative cooler LAMEE.

10. The evaporative cooling system of claim 8, further comprising a regeneration system coupled to the dehumidification LAMEE via a desiccant line, the regeneration system configured to receive the liquid desiccant fluid via the desiccant line and to remove moisture from the liquid desiccant fluid by at least one of heating, filtering, membrane distillation, or a vacuum process to increase a concentration of desiccant within the liquid desiccant fluid.

11. The evaporative cooling system of claim 1, further comprising an air-to-air heat exchanger (AAHE) disposed within the scavenger air plenum downstream of the evaporative cooler LAMEE in a direction of flow of the scavenger air stream and within the process air plenum upstream of the first LAHE in a direction of flow of the process air stream, the AAHE configured to receive both the scavenger air stream and the process air stream and to allow the scavenger air stream to absorb heat from the process air stream prior to the process air stream entering the first LAHE.

12. The evaporative cooling system of claim 1, wherein the scavenger air stream is separate and distinct from the process air stream.

13. An evaporative cooling system comprising:
an evaporative cooler liquid-to-air membrane energy exchanger (LAMEE) disposed within a scavenger air plenum that is configured to channel a scavenger air stream, the evaporative cooler LAMEE being configured to exchange latent and sensible energy between the scavenger air stream and water without exchanging energy between the scavenger air stream and any other liquid, the evaporative cooler LAMEE configured to receive only water through a liquid inlet and to evaporatively cool the water by allowing the water to evaporate into the scavenger air stream, the evaporative cooler LAMEE comprising one or more semi-permeable membranes and being configured to direct the water and the scavenger air stream through one or more separate channels divided by the one or more semi-permeable membranes;
a closed cooling liquid circuit that is configured to circulate the water between the evaporative cooling LAMEE and a first liquid-to-air heat exchanger (LAHE), the first LAHE disposed within a process air plenum that is configured to channel a process air stream, the first LAHE configured to receive the water from the evaporative cooler LAMEE and to allow the water to absorb heat from and cool the process air stream;

a fan disposed within the scavenger air plenum, the fan being configured to vary a rate of flow of the scavenger air stream to modify an amount of cooling of the process air stream; and an air-to-air heat exchanger (AAHE) disposed within the scavenger air plenum downstream of the evaporative cooler LAMEE in a direction of flow of the scavenger air stream, the AAHE configured to receive the scavenger air exhaust stream and to allow the scavenger air exhaust stream to absorb heat from at least one of the process air stream upstream of the first LAHE in a direction of flow of the process air stream or the scavenger air supply stream upstream of the evaporative cooler LAMEE to cool the process air stream or the scavenger air supply stream, respectively, and wherein the scavenger air plenum comprises a scavenger air inlet and a scavenger air outlet, wherein outside air enters the scavenger air inlet as the scavenger air stream, wherein the scavenger air stream is channeled through the scavenger air plenum and is discharged outside of an enclosed space through the scavenger air outlet, wherein the process air plenum comprises a process air inlet and a process air outlet, wherein return air from the enclosed space enters the process air inlet as the process air stream, and wherein the process air stream is channeled through the process air plenum and is discharged into the enclosed space through the process air outlet as conditioned supply air.

14. The evaporative cooling system of claim 13, wherein the AAHE is disposed within the scavenger air plenum and the process air plenum at a location upstream of the first LAHE in a direction of flow of the process air stream, the AAHE is configured to allow the scavenger air exhaust stream to absorb heat from the process air stream prior to the process air stream entering the first LAHE.

15. The evaporative cooling system of claim 13, wherein a downstream portion of the scavenger air plenum downstream of the evaporative cooler LAMEE in the direction of flow of the scavenger air is at least one of curved or angled to be at least proximate to an upstream portion of the scavenger air plenum upstream of the evaporative cooler LAMEE, the AAHE disposed within the downstream portion of the scavenger air plenum and the upstream portion of the scavenger air plenum to allow the scavenger air exhaust stream to absorb heat from the scavenger air supply stream prior to the scavenger air supply stream entering the evaporative cooler LAMEE.

16. The evaporative cooling system of claim 13, wherein the AAHE extends across the evaporative cooler LAMEE from a back of the evaporative cooler LAMEE to a front of the evaporative cooler LAMEE, the AAHE configured to absorb heat from the scavenger air supply stream prior to the scavenger air supply stream entering the evaporative cooler LAMEE through the air inlet.

17. The evaporative cooling system of claim 13, wherein the AAHE is at least one of a heat wheel, a heat pipe, a plate exchanger, or a run-around heat recovery system.

18. The evaporative cooling system of claim 13, wherein the first LAHE is configured to discharge the process air stream as conditioned supply air that is directed to the enclosed space.

19. The evaporative cooling system of claim 13, further comprising a second LAHE disposed within the scavenger air plenum upstream of the evaporative cooler LAMEE in a direction of flow of the scavenger air stream, the second LAHE configured to receive the water from at least one of the evaporative cooler LAMEE or the first LAHE and to allow heat transfer between the water and the scavenger air stream upstream of the evaporative cooler LAMEE.

20. An evaporative cooling method comprising:
channeling a scavenger air stream through an evaporative cooler liquid-to-air membrane energy exchanger (LAMEE) that is disposed within a scavenger air plenum, the evaporative cooler LAMEE comprising one or more semi-permeable membranes and being configured to direct water and the scavenger air stream through one or more separate channels divided by the one or more semi-permeable membranes, the evaporative cooler LAMEE being configured to exchange latent and sensible energy between the scavenger air stream and the water without exchanging energy between the scavenger air stream and any other liquid;

channeling a process air stream through a first liquid-to-air heat exchanger (LAHE) that is disposed within a process air plenum;

circulating the water between the evaporative cooler LAMEE and the first LAHE through a closed cooling liquid circuit;

evaporatively cooling the water within the evaporative cooler LAMEE utilizing the scavenger air stream;

receiving the water at the first LAHE from the evaporative cooler LAMEE, wherein the receiving operation includes allowing the water to absorb heat from the process air stream to cool the process air stream; and varying a rate of flow of the scavenger air stream to modify an amount of cooling of the process air stream, and wherein the scavenger air plenum comprises a scavenger air inlet and a scavenger air outlet, wherein outside air enters the scavenger air inlet as the scavenger air stream, wherein the scavenger air stream is channeled through the scavenger air plenum and is discharged outside of an enclosed space through the scavenger air outlet, wherein the process air plenum comprises a process air inlet and a process air outlet, wherein return air from the enclosed space enters the process air inlet as the process air stream, and wherein the process air stream is channeled through the process air plenum and is discharged into the enclosed space through the process air outlet as conditioned supply air.

21. The method of claim 20, further comprising discharging the process air stream from the first LAHE as conditioned supply air and directing the conditioned supply air to the enclosed space.

22. The method of claim 20, wherein the evaporatively cooling operation includes allowing the water to evaporate into the scavenger air stream.

23. The method of claim 20, wherein the circulating operation further includes circulating the water to a second LAHE disposed within the scavenger air plenum upstream of the evaporative cooler LAMEE in a direction of flow of the scavenger air stream, the second LAHE configured to receive the water from at least one of the evaporative cooler LAMEE or the first LAHE and to allow the water to absorb heat from the scavenger air stream to prior to the scavenger air stream entering the evaporative cooler LAMEE.

24. The method of claim 20, further comprising channeling a scavenger air exhaust stream of the scavenger air stream exiting the evaporative cooler LAMEE to an air-to-air heat exchanger (AAHE) disposed in the scavenger air plenum, the AAHE configured to additionally receive at least one of the process air stream upstream of the first LAHE in a direction of flow of the process air stream or a scavenger air supply stream of the scavenger air stream upstream of the evaporative cooler LAMEE in a direction of flow of the scavenger air stream, the AAHE further configured to allow the scavenger air exhaust stream to absorb heat from the at least one of process air stream or scavenger air supply stream to pre-cool the at least one air stream.

25. The method of claim 20, further comprising channeling the scavenger air stream through a dehumidification LAMEE disposed in the scavenger air plenum upstream of the evaporative LAMEE in a direction of flow of the scavenger air stream, circulating a liquid desiccant fluid through the dehumidification LAMEE to allow the liquid desiccant fluid to absorb at least one of moisture or heat from the scavenger air stream within the dehumidification LAMEE, and selectively adjusting a concentration of the liquid desiccant fluid to modify at least one of the humidity or the temperature of the scavenger air stream prior to entering the evaporative cooler LAMEE.

26. The method of claim 20, wherein the circulating operation further includes circulating the water to a chiller disposed along the closed cooling liquid circuit between the evaporative cooler LAMEE and the first LAHE, the method further comprising selectively operating the chiller to provide additional cooling of the water prior to the water entering the first LAHE when the chiller is operating.

27. The method of claim 20, further comprising adjusting a flow rate of the process air stream through the process air plenum using one or more fans to modify an amount of cooling of the process air stream.

28. The method of claim 20, further comprising diverting the scavenger air stream around the evaporative cooler LAMEE through a first air bypass route and diverting the process air stream around the first LAHE, through a second air bypass route when evaporative cooling is not desired based on a current condition of at least one of the scavenger air stream or the process air stream.

* * * * *